United States Patent
Witter et al.

(10) Patent No.: US 10,103,769 B2
(45) Date of Patent: Oct. 16, 2018

(54) PROTECTIVE ENCLOSURE FOR AN ELECTRONIC DEVICE

(71) Applicant: OTTER PRODUCTS, LLC, Fort Collins, CO (US)

(72) Inventors: Kevin W. Witter, Fort Collins, CO (US); Matthew S. Krajec, Loveland, CO (US); Patrick J. Nelson, Fort Collins, CO (US); Paul N. Walker, Fort Collins, CO (US); Thomas D. Boileau, Fort Collins, CO (US)

(73) Assignee: Otter Products, LLC, Fort Collins, CO (US)

( * ) Notice: Subject to any disclaimer, the term of this patent is extended or adjusted under 35 U.S.C. 154(b) by 0 days.

(21) Appl. No.: 15/671,238

(22) Filed: Aug. 8, 2017

(65) Prior Publication Data

US 2017/0359096 A1    Dec. 14, 2017

Related U.S. Application Data

(63) Continuation of application No. 15/297,784, filed on Oct. 19, 2016, now Pat. No. 9,871,550, which is a
(Continued)

(51) Int. Cl.
*H04B 1/3888* (2015.01)
*H05K 5/03* (2006.01)
(Continued)

(52) U.S. Cl.
CPC ............ *H04B 1/3888* (2013.01); *A45C 5/02* (2013.01); *A45C 11/00* (2013.01); *A45F 5/00* (2013.01);
(Continued)

(58) Field of Classification Search
CPC ......... H04B 1/3888; A45C 5/02; A45C 11/00; A45C 2011/001; A45C 2011/002;
(Continued)

(56) References Cited

U.S. PATENT DOCUMENTS

| 3,023,885 A | 3/1962 | Kindseth |
| 4,029,999 A | 6/1977 | Neumann et al. |

(Continued)

FOREIGN PATENT DOCUMENTS

| CN | 202488509 U | 10/2012 |
| KR | 200446444 | 10/2009 |

(Continued)

*Primary Examiner* — Hai V Nguyen

(57) ABSTRACT

A protective enclosure for use with an electronic device includes a bottom shell, a first cushioning member, and a second cushioning member. The bottom shell includes a back portion and walls attached to the back portion to form a cavity for receiving and removably retaining the electronic device. The bottom shell also includes an aperture configured to provide direct access to the touch screen of the installed electronic device. The first cushioning layer is overmolded onto at least the inner surface of the of back portion of the bottom shell and configured to contact and cushion at least a back surface of the installed electronic device. The second cushioning layer is separate from the first cushioning layer and includes a perimeter cushioning member overmolded onto at least a portion of the walls of the bottom shell.

20 Claims, 15 Drawing Sheets

Related U.S. Application Data continuation of application No. 15/040,713, filed on Feb. 10, 2016, now Pat. No. 9,503,147, which is a continuation of application No. 14/591,537, filed on Jan. 7, 2015, now Pat. No. 9,295,174.

(60) Provisional application No. 61/924,423, filed on Jan. 7, 2014.

(51) Int. Cl.

| | | |
|---|---|---|
| B65D 81/02 | (2006.01) | |
| A45C 11/00 | (2006.01) | |
| G06F 1/16 | (2006.01) | |
| A45C 5/02 | (2006.01) | |
| A45F 5/00 | (2006.01) | |
| H04M 1/02 | (2006.01) | |

(52) U.S. Cl.
CPC ......... *B65D 81/022* (2013.01); *G06F 1/1656* (2013.01); *H04M 1/0202* (2013.01); *H05K 5/03* (2013.01); *A45C 2011/001* (2013.01); *A45C 2011/002* (2013.01); *A45C 2011/003* (2013.01); *G06F 2200/1633* (2013.01)

(58) Field of Classification Search
CPC ... A45C 2011/003; A45F 5/00; B65D 81/022; G06F 1/1656; G06F 2200/1633; H04M 1/0202; H05K 5/03
USPC .......................................... 455/575.8, 575.1
See application file for complete search history.

(56) References Cited

U.S. PATENT DOCUMENTS

| | | |
|---|---|---|
| 4,097,878 A | 6/1978 | Cramer |
| 4,584,718 A | 4/1986 | Fuller |
| 5,025,921 A | 6/1991 | Gasparaitis et al. |
| 5,123,044 A | 6/1992 | Tate |
| 5,138,523 A | 8/1992 | Benck et al. |
| 5,360,108 A | 11/1994 | Alagia |
| 5,368,159 A | 11/1994 | Doria |
| 5,380,968 A | 1/1995 | Morse |
| 5,383,091 A | 1/1995 | Snell |
| 5,386,084 A | 1/1995 | Risko |
| 5,388,691 A | 2/1995 | White |
| 5,388,692 A | 2/1995 | Withrow et al. |
| D365,927 S | 1/1996 | Cho |
| 5,508,479 A | 4/1996 | Schooley |
| 5,541,813 A | 7/1996 | Satoh et al. |
| 5,671,120 A | 9/1997 | Kikinisi |
| 6,115,248 A | 9/2000 | Canova et al. |
| 6,311,017 B1 | 10/2001 | Mori |
| 6,317,313 B1 | 11/2001 | Mosgrove et al. |
| 6,349,824 B1 | 2/2002 | Yamada |
| 6,375,009 B1 | 4/2002 | Lee |
| 6,445,577 B1 | 9/2002 | Madsen et al. |
| 6,456,487 B1 | 9/2002 | Hetterick |
| 6,490,155 B2 | 12/2002 | Han et al. |
| 6,545,862 B1 | 4/2003 | Gettemy et al. |
| 6,616,111 B1 | 9/2003 | White |
| 6,625,394 B2 | 9/2003 | Smith et al. |
| 6,626,362 B1 | 9/2003 | Steiner et al. |
| 6,701,159 B1 | 3/2004 | Powell |
| 6,762,935 B2 | 7/2004 | Hidewasa |
| 6,865,076 B2 | 3/2005 | Lunsford |
| 6,966,519 B2 | 11/2005 | Salentine et al. |
| 7,050,841 B1 | 5/2006 | Onda |
| 7,072,699 B2 | 7/2006 | Eiden |
| D526,780 S | 8/2006 | Richardson et al. |
| 7,194,291 B2 | 3/2007 | Peng |
| D542,524 S | 5/2007 | Richardson et al. |
| 7,236,588 B2 | 6/2007 | Gartrell |
| 7,343,184 B2 | 3/2008 | Rostami |
| 7,359,184 B2 | 4/2008 | Lord |
| D574,819 S | 8/2008 | Andre et al. |
| D581,155 S | 11/2008 | Richardson et al. |
| D581,421 S | 11/2008 | Richardson et al. |
| D587,008 S | 2/2009 | Richardson et al. |
| D589,016 S | 3/2009 | Richardson et al. |
| 7,555,325 B2 | 6/2009 | Goros |
| 7,558,594 B2 | 7/2009 | Wilson |
| 7,688,580 B2 | 3/2010 | Richardson et al. |
| 7,889,489 B2 | 2/2011 | Richardson et al. |
| 7,907,394 B2 | 3/2011 | Richardson et al. |
| 7,933,122 B2 | 4/2011 | Richardson et al. |
| 8,049,727 B2 | 11/2011 | Hanson et al. |
| 8,204,561 B2 * | 6/2012 | Mongan ................. A45C 11/00 206/592 |
| 8,442,604 B1 | 5/2013 | Diebel |
| 8,453,344 B2 | 6/2013 | Nishiwaki et al. |
| 8,457,701 B2 * | 6/2013 | Diebel ................. H04B 1/3888 206/701 |
| 8,490,783 B1 | 7/2013 | Fan |
| 8,509,865 B1 | 8/2013 | LaColla et al. |
| 8,567,599 B2 | 10/2013 | Beatty et al. |
| 8,599,547 B2 | 12/2013 | Richardson et al. |
| 8,676,281 B1 * | 3/2014 | Caulder ............... H04M 1/0283 455/575.1 |
| 8,755,852 B2 * | 6/2014 | Hynecek ............... A45C 11/00 455/575.8 |
| 8,777,002 B2 * | 7/2014 | Lonsdale, II ......... G06F 1/1626 206/320 |
| 8,798,675 B2 | 8/2014 | Salmon et al. |
| 8,800,762 B2 * | 8/2014 | Fathollahi ............ H04B 1/3888 206/320 |
| 8,965,458 B2 | 2/2015 | Richardson et al. |
| 9,008,738 B1 | 4/2015 | Dong |
| 9,060,580 B2 * | 6/2015 | Tages ..................... A45C 11/00 |
| 9,089,056 B2 | 7/2015 | Rayner |
| 9,098,238 B2 | 8/2015 | Richardson et al. |
| 9,125,297 B2 | 9/2015 | Magness |
| 9,136,897 B2 * | 9/2015 | Hynecek ............... H04B 1/3888 |
| 9,266,664 B2 * | 2/2016 | Bau ........................ B65D 85/00 |
| 9,295,174 B2 * | 3/2016 | Witter ...................... H05K 5/03 |
| 9,316,026 B2 * | 4/2016 | Myers ................. E05B 73/0005 |
| 9,408,448 B2 * | 8/2016 | Kay ........................ A45C 13/36 |
| D766,226 S * | 9/2016 | Wu ............................ D14/250 |
| D766,227 S * | 9/2016 | Wu ............................ D14/250 |
| D769,855 S * | 10/2016 | Deng ......................... D14/250 |
| 9,462,099 B2 * | 10/2016 | Wilson ................. H04M 1/185 |
| 9,481,490 B2 | 11/2016 | Venida et al. |
| 9,487,376 B2 | 11/2016 | Salentine et al. |
| 9,503,147 B2 * | 11/2016 | Witter ...................... H05K 5/03 |
| 9,537,526 B2 * | 1/2017 | Wilson ................... H04M 1/18 |
| 9,545,140 B1 * | 1/2017 | Johnson ................ A45C 11/00 |
| 9,615,476 B2 * | 4/2017 | Rayner ................... H05K 5/061 |
| 9,622,556 B2 * | 4/2017 | Fathollahi .............. A45C 11/00 |
| 9,654,605 B2 * | 5/2017 | Goldfain ............... A45C 11/182 |
| 9,660,684 B2 * | 5/2017 | Rayner ................... H01H 13/06 |
| 9,743,540 B2 * | 8/2017 | Magness ................. H05K 5/02 |
| 9,774,713 B2 * | 9/2017 | Guerdrum ........... H04M 1/0264 |
| 9,788,620 B1 * | 10/2017 | Parkinson ............... A45C 11/00 |
| 9,807,211 B2 * | 10/2017 | Guerdrum ........... H04M 1/0264 |
| D808,376 S * | 1/2018 | Kim ............................ D14/250 |
| D808,377 S * | 1/2018 | Witter ........................ D14/250 |
| 9,871,550 B2 * | 1/2018 | Witter ...................... H05K 5/03 |
| 2002/0065054 A1 | 5/2002 | Humphreys et al. |
| 2002/0079244 A1 | 6/2002 | Kwong |
| 2005/0088811 A1 | 4/2005 | Ulla et al. |
| 2005/0224508 A1 | 10/2005 | Tajiri et al. |
| 2005/0279661 A1 | 12/2005 | Hodges |
| 2006/0172765 A1 | 8/2006 | Lev |
| 2006/0237495 A1 | 10/2006 | Chen et al. |
| 2006/0255493 A1 | 11/2006 | Fouladpour |
| 2007/0071423 A1 | 3/2007 | Fantone et al. |
| 2007/0115387 A1 | 5/2007 | Ho |
| 2007/0146985 A1 | 6/2007 | Mick et al. |
| 2007/0158220 A1 | 7/2007 | Cleereman et al. |
| 2007/0297149 A1 | 12/2007 | Richardson et al. |
| 2008/0163463 A1 | 7/2008 | Hulden |
| 2009/0034169 A1 | 2/2009 | Richardson et al. |
| 2009/0237377 A1 | 9/2009 | Lai et al. |
| 2009/0283184 A1 | 11/2009 | Han |

(56) References Cited

U.S. PATENT DOCUMENTS

| | | | |
|---|---|---|---|
| 2010/0006468 A1 | 1/2010 | Lin | |
| 2010/0093412 A1 | 4/2010 | Serra et al. | |
| 2010/0122756 A1 | 5/2010 | Longinotti-Buitoni | |
| 2010/0147737 A1* | 6/2010 | Richardson | A45C 11/00 206/701 |
| 2010/0203931 A1* | 8/2010 | Hynecek | A45C 11/00 455/575.8 |
| 2010/0230301 A1 | 9/2010 | Fellig | |
| 2011/0064401 A1 | 3/2011 | DeSorbo | |
| 2011/0192857 A1 | 8/2011 | Rothbaum et al. | |
| 2011/0228459 A1 | 9/2011 | Richardson et al. | |
| 2011/0294556 A1 | 12/2011 | Carlberg et al. | |
| 2012/0018325 A1 | 1/2012 | Kim | |
| 2012/0031788 A1* | 2/2012 | Mongan | A45C 11/00 206/320 |
| 2012/0037524 A1* | 2/2012 | Lonsdale, II | G06F 1/1626 206/320 |
| 2012/0037536 A1 | 2/2012 | Thomas et al. | |
| 2012/0111881 A1 | 5/2012 | Gaddis, II et al. | |
| 2012/0287565 A1 | 11/2012 | Bennett | |
| 2013/0027862 A1 | 1/2013 | Rayner | |
| 2013/0088813 A1 | 4/2013 | Su et al. | |
| 2013/0098788 A1 | 4/2013 | McCarville et al. | |
| 2013/0126533 A1* | 5/2013 | Klosky | B65D 25/00 220/560 |
| 2013/0175186 A1* | 7/2013 | Simmer | G06F 1/1626 206/37 |
| 2013/0220841 A1 | 8/2013 | Yang | |
| 2013/0220847 A1 | 8/2013 | Fisher et al. | |
| 2013/0240578 A1 | 9/2013 | Yu | |
| 2013/0292269 A1* | 11/2013 | Tages | A45C 11/00 206/37 |
| 2013/0292288 A1* | 11/2013 | Willes | H04M 1/185 206/521 |
| 2014/0049142 A1 | 2/2014 | Magness | |
| 2014/0065847 A1 | 3/2014 | Salmon et al. | |
| 2014/0080553 A1* | 3/2014 | Torset | G06F 1/1632 455/575.8 |
| 2014/0097102 A1 | 4/2014 | Piatt et al. | |
| 2014/0099526 A1 | 4/2014 | Powell et al. | |
| 2014/0128132 A1 | 5/2014 | Cox | |
| 2014/0152890 A1* | 6/2014 | Rayner | G06F 1/1626 348/376 |
| 2014/0166707 A1 | 6/2014 | Leisey-Bartsch | |
| 2014/0183064 A1 | 7/2014 | Ge | |
| 2014/0183065 A1 | 7/2014 | Toulotte | |
| 2014/0187289 A1 | 7/2014 | Cataldo et al. | |
| 2014/0227026 A1 | 8/2014 | O'Neill et al. | |
| 2014/0228074 A1 | 8/2014 | Kulkarni et al. | |
| 2014/0262848 A1* | 9/2014 | Fathollahi | A45C 11/00 206/37 |
| 2014/0262934 A1* | 9/2014 | Fathollahi | A45C 13/002 206/774 |
| 2014/0265765 A1 | 9/2014 | Khodapanah et al. | |
| 2014/0265767 A1* | 9/2014 | Fathollahi | H04B 1/3888 312/223.4 |
| 2014/0299488 A1 | 10/2014 | Andrew | |
| 2014/0302896 A1 | 10/2014 | Xu et al. | |
| 2015/0061477 A1* | 3/2015 | Wilson | H04B 1/3888 312/223.1 |
| 2015/0062787 A1* | 3/2015 | Wilson | H04M 1/185 361/679.01 |
| 2015/0068935 A1 | 3/2015 | Kay et al. | |
| 2015/0083615 A1 | 3/2015 | Lay et al. | |
| 2015/0133183 A1 | 5/2015 | Alameh et al. | |
| 2015/0141090 A1 | 5/2015 | Hwan et al. | |
| 2015/0141095 A1 | 5/2015 | Kim | |
| 2015/0172431 A1 | 6/2015 | Huang | |
| 2015/0194997 A1* | 7/2015 | Johnson | H04B 1/3888 455/575.8 |
| 2015/0194998 A1* | 7/2015 | Fathollahi | H04B 1/3888 455/575.8 |
| 2015/0195938 A1* | 7/2015 | Witter | H05K 5/03 206/521 |
| 2015/0201723 A1* | 7/2015 | Rayner | G06F 1/1601 224/191 |
| 2015/0220766 A1* | 8/2015 | Russell | G06K 7/10881 235/462.42 |
| 2015/0257285 A1* | 9/2015 | Wilson | H04M 1/18 224/235 |
| 2015/0257287 A1* | 9/2015 | Tages | A45C 11/00 224/191 |
| 2016/0007705 A1 | 1/2016 | Liebers et al. | |
| 2016/0080024 A1* | 3/2016 | Wilson | H04M 1/18 455/575.8 |
| 2016/0122821 A1* | 5/2016 | Liu | C12Q 1/6883 514/211.13 |
| 2016/0142093 A1* | 5/2016 | Phang | H04B 1/3888 455/575.8 |
| 2016/0164565 A1* | 6/2016 | Witter | H05K 5/03 455/575.8 |
| 2016/0254836 A1* | 9/2016 | Alsberg | H04B 1/3888 455/575.8 |
| 2016/0261133 A1 | 9/2016 | Wang | |
| 2016/0286920 A1* | 10/2016 | Lean | A45C 11/00 |
| 2016/0286921 A1 | 10/2016 | Northrup et al. | |
| 2017/0026498 A1 | 1/2017 | Goldfain et al. | |
| 2017/0041037 A1* | 2/2017 | Witter | H05K 5/03 |
| 2017/0099924 A1* | 4/2017 | Fathollahi | A45C 13/002 |
| 2017/0119120 A1* | 5/2017 | Richardson | A45C 11/00 |
| 2017/0237460 A1* | 8/2017 | Rayner | H01H 13/06 455/575.8 |
| 2017/0279478 A1* | 9/2017 | Fathollahi | H04B 1/3888 |
| 2017/0353208 A1* | 12/2017 | Wilson | H04M 1/18 |

FOREIGN PATENT DOCUMENTS

| | | |
|---|---|---|
| KR | 101394285 | 5/2014 |
| WO | 1994000037 A1 | 1/1994 |
| WO | 1999041958 A1 | 8/1999 |
| WO | 2015103599 A1 | 7/2015 |

\* cited by examiner

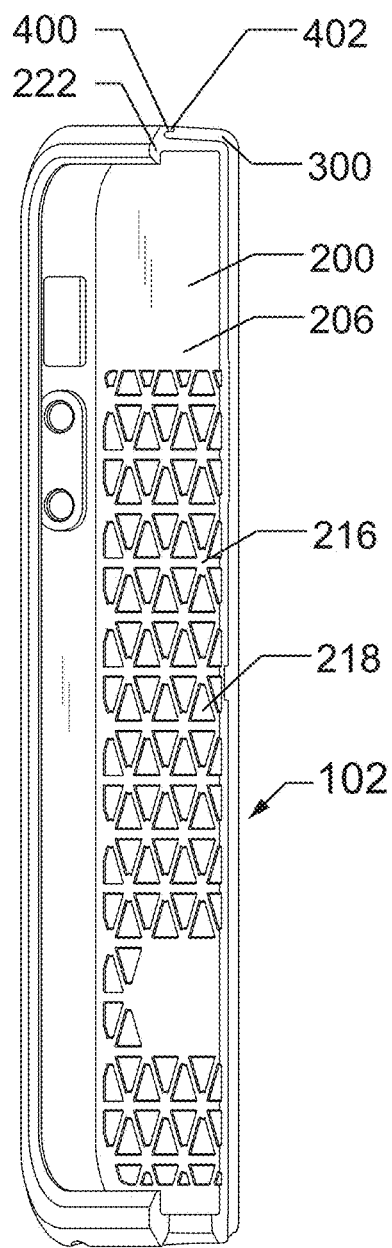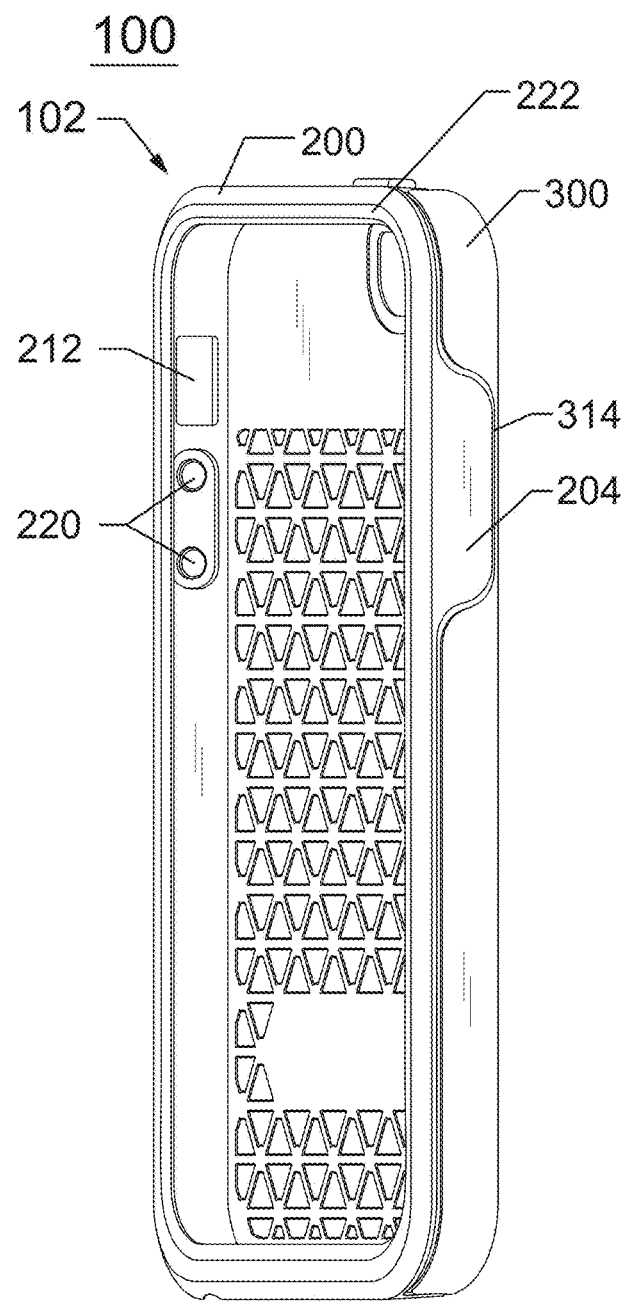
FIG. 3A
FIG. 3B

PROTECTIVE ENCLOSURE FOR AN ELECTRONIC DEVICE

CROSS-REFERENCE TO RELATED APPLICATIONS

This application is a continuation of U.S. patent application Ser. No. 15,297,784, filed Oct. 19, 2016, which is a continuation of U.S. patent application Ser. No. 15/040,713, filed Feb. 10, 2016, which is a continuation of U.S. patent application Ser. No. 14/591,537, filed Jan. 7, 2015, which claims benefit to U.S. Provisional Patent Application No. 61/924,423, filed on Jan. 7, 2014, the contents of which are hereby incorporated by reference in their entireties.

BACKGROUND

Various types of electronic devices are used for communication and entertainment purposes. These devices include computers, tablets, audio players, video players, smart phones, two-way radios, and GPS receivers. These devices often include touch screens, keyboards, scroll wheels, switches, or other interactive controls. Due to the sensitive nature and high cost of these electronic devices, it is desirable to protect these devices from physical damage that can result from everyday usage.

Many two-piece and three-piece protective enclosures exist and provide cushion and structural layers for electronic device protection. However, many of these cases require a user to follow a relatively complicated set of instructions to assemble the multi-piece protective enclosure around the electronic device. To avoid these assembly steps, it is desirable to provide a one-piece protective enclosure that provides easy installation and removal and equal or superior protective benefits as the multi-piece protective solutions.

SUMMARY

In one aspect, a protective enclosure for an electronic device is provided. The electronic device can be a device that needs protection from droppage and mishandling and/or damage. The electronic device can be a mobile phone or tablet computer. The electronic device can also be a digital assistant, a computer, a camera, music player, GPS device, or the like.

The electronic device can have a front surface. The front surface of the electronic device can comprise a capacitive sensing touch screen. In other embodiments, the front surface of the electronic device can have a keyboard or buttons along with a touch screen or other display. The electronic device can have a back surface and together with the front surface the electronic device can be surrounded by a perimeter portion.

The electronic device can have side surfaces. The side surfaces can include a top-side surface, a bottom-side surface and opposing side surfaces. The side surfaces along with the front surface and bottom surface provide the housing of the electronics, battery, and other components of the electronic device. The side surfaces of the electronic device can have additional features of the electronic device, including buttons and controls and access points.

The electronic device can have buttons and controls that along with the touch screen make the electronic device function fully. The buttons on the electronic device can be a power button, can be volume controls, can be a silencing toggle, and in some instances the buttons can be a keyboard or other controls for enabling the electronic device to function.

The electronic device can have a camera. The camera can be located on a surface of the electronic device and in some instances can be located on the back surface of the electronic device. The camera can include a flash and in some instances other features might be located near the camera of the electronic device, including a speaker, microphone, or other sensors.

The electronic device can have a speaker. The speaker can be located on a surface of the electronic device and in some instances can be located along a perimeter surface of the electronic device and on a bottom surface of the electronic device. The electronic device can also have accessible areas for power connections and for headphone connections. These areas can be located along a surface of the electronic device and in some instances be located on the bottom surface of the electronic device.

The protective enclosure is configured such that the electronic device can fit within the protective enclosure and be protected from drops, shocks, damage, misuse, and the like. In certain instances, the protective enclosure can include a bottom shell. In certain instances, the bottom shell can have an elongated body that has a surface surrounded by a perimeter portion. In some embodiments, the perimeter portion can include a retaining wall that can extend from the surface of the bottom shell. In some embodiments, the retaining wall can have a top-side wall portion, a bottom-side wall portion, a left side wall portion, and right side wall portion. In other instances, the retaining wall can have only a top-side wall portion, only a bottom-side wall portion, or only side wall portions. In other instances, the retaining wall can have a combination of a top-side wall portion and a side wall portion, or a bottom-side wall portion and a side wall portion. And in other instances, the retaining wall can only have side wall portions.

In certain embodiments, the wall portions and the surface of the bottom shell can create a cavity. The cavity of the bottom shell can retain and house the electronic device and the cavity can be shaped similar to the shape of the electronic device. In certain embodiments, the cavity of the bottom shell can be shaped to fit a mobile phone. In other instances, the bottom shell can be shaped to fit a tablet computer, a camera, a music player, a GPS device, or the like.

In certain embodiments, the wall portions of the bottom shell can be the same height as the side portions of the electronic device. The wall portions can also be a portion of the height of the side portions of the electronic device. In other embodiments, the wall portions of the bottom shell can only be a small portion of the side portions of the electronic device, only wrapping around the change in surface from the back of the electronic device to the side surface of the electronic device.

In certain embodiments, the elongated body of the bottom shell can have an inner surface and an outer surface. The outer surface can be the surface that a user of the electronic device feels when the electronic device is installed into the protective enclosure. In certain instances, the outer surface of the bottom shell can extend around to the top-side wall portion, the bottom-side wall portion, and the side wall portions of the bottom shell. In other embodiments, the outer surface of the bottom shell of the protective enclosure can extend around only the top-side wall portion, only the bottom-side wall portion, only the side portions, or in other embodiments a combination of the wall portions of the bottom shell.

In certain embodiments, the bottom shell of the protective enclosure can have one or more cut out regions. The cut out regions can be located along the left side wall portion and the right side wall portion. In other instances, the cut out regions can be located on the top-side wall portion and/or the bottom-side wall portion. The cutouts can be the size of a portion of one of the wall portions of the bottom shell or the cut out regions can be the entire size of one of the wall portions of the bottom shell that the cutout is located. In other instances, one cut out region of the bottom shell can be a different size than another cutout of the bottom shell in the same protective enclosure.

The cut out regions of the bottom shell of a protective enclosure can be adapted to accommodate an overmolded material to fill in the cut out regions. In certain embodiments, the cutouts are located along the left and right side walls of the bottom shell to accommodate a bending of the bottom shell along the elongated body of the bottom shell. In certain embodiments, the bending of the bottom shell can assist with inserting an electronic device into the protective enclosure.

In certain embodiments, the bottom shell of the protective enclosure can have a thinner region along the bottom shell. The thinner region can extend along a portion of the bottom shell or can extend along the entire length of the bottom shell. In some instances, the thinner region can extend from one cut out region on the left side wall portion to the other cut out region on the right side wall portion. In certain instances, the thinner region can a region of the protective enclosure to flex away from the back of the electronic device during installation and removal of the electronic device.

The cut out regions of the bottom shell can accommodate access to the functional aspects and control features of an electronic device. The cut out regions can be positioned along the wall portions on the bottom shell to provide access to the volume controls, the silence toggle switch, the power button, and the like of the electronic device. When aligned with a control feature of the electronic device, the cut out region allows functional access to the control feature of the electronic device while the electronic device remains housed and retained within the protective enclosure.

In certain embodiments, the bottom shell of the protective enclosure can have a camera feature and camera opening. The camera feature can be located on the outer surface of the bottom shell and in some instances can be aligned with the camera of an electronic device. The camera opening can be the same shape as the camera of the electronic device or in certain embodiments can be larger than the size of the camera of the electronic device.

In certain embodiments, the camera feature of the bottom shell can be aligned with the camera of a tablet computer or can be aligned with the lens portion of a camera. The camera feature can be of the same material and color of the bottom shell or in other instances can be a specific color to prevent any distortion of the camera usage of the electronic device when the electronic device is retained in the protective enclosure. In some instances, the color of the camera feature can be black or a dark color as to not interfere with the quality of the camera of the electronic device. In other embodiments, the camera feature of the bottom shell of the protective enclosure can include a lens, a lens gasket, and a flash. The lens, lens gasket, and flash of the protective enclosure can help to protect the camera of the electronic device and can also assist to enhance the quality of a camera when the electronic device is housed and retained within the protective enclosure.

In certain embodiments, the bottom shell of the protective enclosure can have a protrusion on the inner surface of the bottom shell. The protrusion can be shaped to interact with a feature of the protective enclosure, and in some embodiments can interact with on overmolded layer that fits on the inner surface of the bottom shell of the protective enclosure.

In certain embodiments, the protective enclosure can include a first cushioning layer. The first cushioning layer can comprise a front surface and a back surface. In certain embodiments the first cushioning layer can have a proximal portion, a distal portion, and side portions. In certain embodiments, the first cushioning layer can have an elongated body defined by the shape of the front surface and of the back surface.

The back surface of the first cushioning layer of certain embodiments of the protective enclosure can be overmolded onto the inner surface of the bottom shell and create a back portion of the protective enclosure that houses an electronic device. In other embodiments, the first cushioning layer can be overmolded onto the inner surface of the bottom shell along the top-side wall portion, along the bottom-side wall portion, along the left side wall portion and along the right side wall portion, or any variation of the wall portions.

In certain embodiments, the front surface of the first cushioning layer can rest against the back surface of the electronic device and provide protection to the electronic device when installed into the protective enclosure.

In other embodiments the first cushioning layer can have a depression on the back surface. The depression can interact or engage with the protrusion or nub in the inner surface of the bottom shell. The depression and protrusion can interact to assist with alignment during the overmolding process between the bottom shell and the first cushioning layer of the protective enclosure.

In certain embodiments, the protective enclosure can include a second cushioning layer. The second cushioning layer can also act as a framework member for the protective enclosure that retains an electronic device.

The framework member can have a surface that is surrounded by a perimeter portion. The perimeter portion can also be considered a perimeter wall. The perimeter wall can include a top wall portion, a bottom wall portion, and opposing side wall portions. In other embodiments, the perimeter portion can only include a top wall portion, or can only include a bottom wall portion, or can only include opposing side wall portions, or any combination of wall portions.

In certain embodiments, the perimeter portion of the framework member can be overmolded with the retaining wall of the bottom shell. The perimeter portion of the framework member can be adapted to form-fit over a perimeter portion of the electronic device. The framework member can be formed to create an elevated protective rim around the perimeter of the electronic device, creating a gap between the front face of the electronic device and a surface that the protective enclosure may rest on.

In certain embodiments, the overmolding of the bottom shell, the first cushioning layer and the second cushioning layer can make these components of the protective enclosure inseparable and can make the protective enclosure a one-piece article. The second cushioning layer can have an expanded portion along the side wall portions of the second cushioning layer. The expanded portions can be overmolded to fit within the cut out regions on the bottom shell and in some embodiments the expanded portions can bend along the perimeter portion of the bottom shell and the second cushioning layer and bend the protective enclosure so as to insert or remove an electronic device more easily.

In certain embodiments, the framework member can be multiple components that overmold onto the bottom shell. The multiple components can be comprised of a top component, a bottom component, and side components. The protective enclosure can include one or more than one of the individual components of the framework member that overmold onto the bottom wall and comprise the protective enclosure that surrounds and houses the electronic device.

In certain embodiments, the framework member can include a plurality of openings. The openings in the framework member or an individual component of the framework member can be located on any wall portion of the framework member and in some instances can be located along the bottom wall portion of the second cushioning layer or framework member. The openings in the framework member can provide access to a component of the electronic device.

In some embodiments the openings can provide access to a power port, headphone jack port, or a silencing toggle of the electronic device. When the framework member is overmolded with the bottom shell of the protective enclosure, the openings of the framework member or second cushioning layer can be located within the cut out regions of the bottom shell.

In certain embodiments, the framework member can include a sound feature. This sound feature can be located in the same location as the speaker of the electronic device when the electronic device is inserted into the protective enclosure. The sound feature of the framework member can provide access to the sound emitted from the electronic device. In other instances, the sound feature of the framework member, or second cushioning layer, can be located near the volume controls of the electronic device. When the electronic device is housed within the protective enclosure, the sound features of the second cushioning layer can be engaged to interact with the volume controls of the electronic device and volume can be increased or decreased by engaging the sound features of the second cushioning layer.

In certain embodiments, the sound features of the second cushioning layer are located within the cut out regions on the bottom wall when the bottom wall and second cushioning layer are overmolded together as the protective enclosure. By having the sound features located within the cut out regions of the bottom wall, the volume controls are easily engaged thru the second cushioning layer and can be easily depressed in order to change the volume of the electronic device when housed within the protective enclosure.

In certain embodiments, the second cushioning layer of the protective enclosure can include a control feature. The control feature can be located on any wall portion of the second cushioning layer, or framework member, and in some instances can be located on a side wall portion. When the electronic device is retained within the protective enclosure, the control feature of the framework member can be located over the power button of the electronic device. The power button of the electronic device can then be activated through the framework member, or second cushioning layer, while retaining the electronic device within the protective enclosure.

In some embodiments, the control feature of the second cushioning layer can be located within the cut out region of the bottom shell when overmolded together to make the protective enclosure. Having the control feature within the cut out region of the bottom wall allows for the second cushion layer to interact with the power button and engage the button to turn the electronic device, which in some instances can be a mobile phone, on and off.

The details of one or more variations of the subject matter described herein are set forth in the accompanying drawings and the following description.

BRIEF DESCRIPTIONS OF DRAWINGS

FIG. 3A is a half-section front isometric view of a protective enclosure for an electronic device;

FIG. 3B is a front isometric view of a protective enclosure for an electronic device;

DETAILED DESCRIPTION

Figure 1:
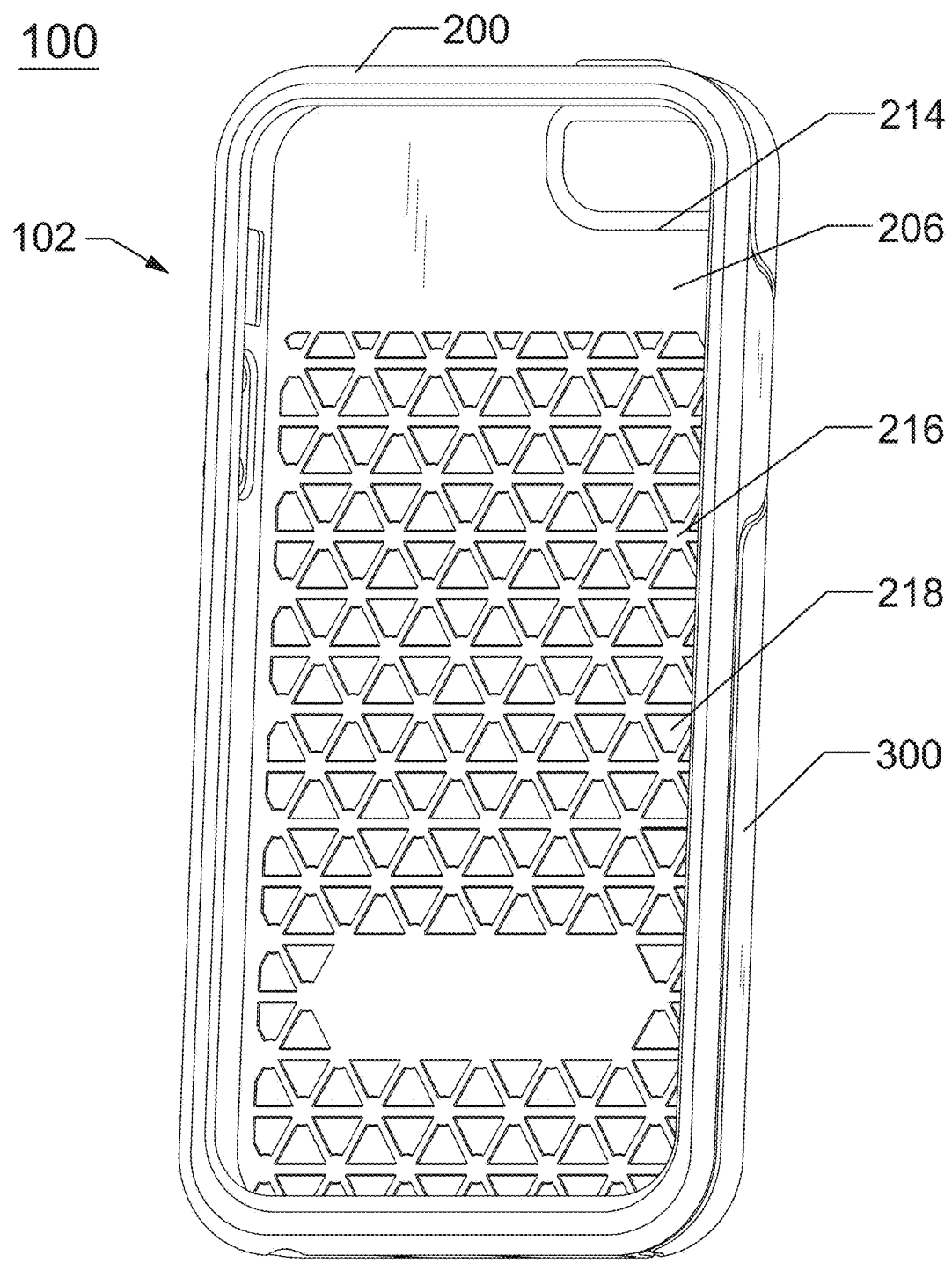
FIG. 1 is a rear isometric view of a protective enclosure for an electronic device.

The subject matter described herein relates to a protective enclosure for an electronic device. It is desired to have the electronic device protected from adverse environmental conditions, mishandling and/or damage, and damage from drops and falls. It is desirable that the protective enclosure for the electronic device be easy to install and it is desirable for the protective enclosure to be a one-piece enclosure. The protective enclosure can be of any appropriate size and dimension so long as it is capable of housing an electronic device and protecting it, for instance from drops and scratches.

Particularly, in certain embodiments, the protective enclosure can be a case for encasing an electronic device, such as a mobile phone, smartphone, tablet computer, personal digital assistant, camera, GPS tracker, health monitor, medical device, such as an insulin pump or glucose monitor, or the like. In other instances, the protective enclosure can be part of the electronic device, which protects the various components and/or electronic circuitry of the electronic device. For example, the protective enclosure can be the housing of a mobile electronic device, or smartphone or medical device, which encases the electronic components of the electronic device.

There are several advantages with the protective enclosure provided herein. In certain exemplary instances, a protective enclosure can provide a measure of shock absorbance for the electronic device housed within the protective enclosure. The protective enclosure can also provide protection against scratching, chipping, breaking, fracturing, and the like of the electronic device and/or a touch screen associated therewith, when housed within the protective enclosure. Another advantage of the protective enclosure provided herein is that, in various particular embodiments, it may be a one-piece assembly, although in other embodiments it may be a multi-part assembly that has been engineered to easily fit together thereby making assembly easy. This overcomes the difficulties of some protective enclosures, or cases, for electronic devices that have multiple components and/or are difficult to assemble and can be confusing and difficult to use.

A protective enclosure of the disclosure may be of any suitable shape, having any suitable size, dependent on the actual dimensions of the device it is meant to encase. However, in certain exemplary instances, the dimensions of one class of protective enclosure can fall within the following ranges. The thickness of various members, whether individually or when overmolded together, can have a thickness of about 25 mm or less, such as 20 mm or less, for instance, about 15 mm or less, including about 10 mm or less, such as about 8 mm or less, or about 5 mm or less, about 4 mm or less, including about 3 mm or less or about 2 mm or less, for example about 1.5 mm or 1.0 mm or less, even about 0.1 mm. For example, in various instances, such as where an electronic device such as a smartphone, tablet computer, electronic reader, camera, or video display is to be contained within the protective enclosure, the thickness of a top portion and/or bottom portion and any side portions, individually or overmolded together, can be less than about 2.5 mm, such as less than about 2.0 mm, less than about 1.5 mm, for example less than 1 mm thick, even about 0.1 mm thick. However, in other instances, the thickness of various members, whether individually or when overmolded together, can have a thickness of about 30 mm or more, such as 40 mm or more, for instance, about 50 mm or more, including about 60 mm or more, such as about 80 mm or more, or even about 100 mm or more.

In certain instances, such as where an electronic device such as a smartphone, tablet computer, electronic reader, camera, or video display is to be contained within the protective enclosure, the weight of any portion of the protective enclosure, individually or overmolded together, can be less than about 5 or about 4 ounces, less than about 4 or about 3 ounces, for instance, less than about 2 or about 1 ounce, including less than about 28 or about 27 grams. Accordingly, in one embodiment, due to the design features described herein, a protective enclosure can be capable of providing shock and drop protection to an electronic device housed within the protective enclosure while only having a thickness and/or weight range in the recited above. However, in various instances, an enclosure of the disclosure may have a weight and construction that is substantially greater than the above, such as more than about 10 or about 20 ounces, more than about 30 or about 50 ounces, for instance, more than about 60 or about 80 ounce, including more than about 100 ounces.

Further, in certain instances, the length and/or width of the protective enclosure may be such that it is no longer or wider than about 25 mm of the underlying electronic device it is designed to encase, no longer or wider than about 20 mm or about 15 mm, for instance, no longer or wider than about 10 mm, including no longer or wider than about 5 mm of the underlying electronic device the protective enclosure is designed to encase. Accordingly, in certain instances, a protective enclosure is configured to be substantially form fitting with the electronic device it is meant to contain. However, in various instances, an enclosure of the disclosure may be substantially longer or wider than the dimensions listed above, such as, for instance, longer or wider by about 50 mm of the underlying electronic device it is designed to encase, longer or wider by about 75 mm or about 85 mm, for instance, longer or wider by about 100 mm than the underlying electronic device the protective enclosure is designed to encase.

To ensure the appropriate thickness, length, and/or width and/or weight of the protective enclosure have been provided, the electronic device can be fitted into the protective enclosure and the protective enclosure can be tested for its ability to provide shock and drop protection, such as by experimentally dropping the protective enclosure and electronic device. In some instances, the protective enclosure with the electronic device housed within can be tested to specific drop standards or even military standards in order to comply with certain specifications set forth by the guarantees of the protection that the protective enclosure can provide for the electronic device. The thickness, length, and/or width and/or weight of the protective enclosure should be provided in such dimensions so that the retained electronic device is not broken, cracked, or otherwise damaged by the dropping and testing.

It is to be understood that although particular embodiments are presented herein, such as a protective enclosure for an electronic device, the electronic device comprising a mobile phone, tablet computer, electronic reader, camera or the like, the device housed may be any number of different shapes, sizes, and configurations, and as such, the herein disclosed enclosures can be of any number of different shapes, sizes, and configurations without departing from the nature of the disclosure. For instance, as herein depicted below, and in references to the appended figures, the protective enclosure may include top portions, such as frame members, and top wall portions, such as walls extending below a surface of a top portion surface, such as substantially normal or at an angle thereto; as well as bottom portions and/or bottom wall portions, such as walls extending above a surface of a bottom portion, e.g., substantially normal or at an angle thereto, and may as well include side portions and perimeter portions, all of which may be configured so that the protective enclosure of the disclosure may be formfitting to the device it is designed to protect. In certain instances, the protective enclosure can be configured so as not to need, and in various instances, does not have any one of the portions or wall portions listed above or a combination of one or more of the portions listed above. Hence, the scope of the protective enclosures described herein with respect to the particular embodiments set forth in reference to the figures is not intended to be unduly limiting.

Accordingly, in one aspect, a protective enclosure for an electronic device is provided. Typically, the electronic device may be a device that needs protection from droppage and mishandling and/or damage. For instance, the electronic device can be a mobile phone or tablet computer. In other instances, the electronic device can also be a digital assistant, a computer, a camera, music player, GPS device, or the like. In typical configurations, the electronic device will have a front surface that may include a capacitive sensing touch screen. In some embodiments, the front surface of the electronic device may alternatively or additionally have a keyboard or buttons, e.g., along with a touch screen or other display. The electronic device will have a back surface and together with the front surface the electronic device will be surrounded by a perimeter portion.

Hence, the typical electronic device will have side surfaces, including a top and bottom-side surface and edge as well as opposing side surfaces and respective edges. The side surfaces along with the front surface and bottom surface provide the housing of the electronics, battery, and other components of the electronic device. The front and side surfaces of the electronic device can also have additional features of the electronic device, including buttons and controls and access points. For instance, the electronic device can have buttons and controls that along with the touch screen make the electronic device function fully. The buttons on the electronic device can be a power button, can be volume controls, can be a silencing toggle, and in some instances the buttons can be a keyboard or other controls for enabling the electronic device to function.

As is typical, the electronic device can also have a camera. The camera can be located on a surface of the electronic device and in some instances can be located on the front and/or back surface of the electronic device. The camera can include a flash and in some instances other features might be located near the camera of the electronic device, including a speaker, microphone, or other sensors. The electronic device may also have one or more microphones, for picking up sounds, and/or one or more speakers for transmitting sounds. The microphones and/or speakers can be located on a surface of the electronic device and in some instances can be located along a perimeter surface of the electronic device and on a bottom surface of the electronic device. The electronic device can also have accessible areas for power connections and for headphone connections. These areas can be located along a surface of the electronic device and in some instances be located on the bottom surface of the electronic device. Accordingly, in various instances, as described herein, the protective enclosures of the disclosure may have various features and configurations, such as cutouts and/or expanded flexible regions that may be configured to accommodate such features, such as control and/or sound transmission features, of the underlying device to be enclosed, so as to ensure the complete functionality of the electronic device, such as while within the case.

Hence, the protective enclosure is configured such that the electronic device can fit within the protective enclosure and be protected from drops, shocks, damage, misuse, and the like, while also, in many cases, allowing full operation of the various features, as described above, of the encased electronic device. In particular, in certain instances, the protective enclosure can include a bottom shell. The bottom shell can have an elongated body that has a main surface, such as a bottom surface surrounded by a perimeter portion. The bottom surface will have an interior surface portion, such as a portion that may be configured to engage a surface, such as a back surface of the electronic device, as well as an exterior our outer surface portion. The main surface will also have a perimeter portion, and the perimeter portion can include a retaining wall that can extend from the main surface of the bottom shell, so as to be substantially normal or angled thereto, such as angled from 1 to 90 degrees in the plus or minus direction from normal. The retaining wall can have a top-side wall portion, a bottom-side wall portion, a left side wall portion, and right side wall portion. In other instances, the retaining wall can have only a top-side wall portion, only a bottom-side wall portion, or only side wall portions, or a mixture of the same. For example, the retaining wall can have a combination of a top-side wall portion and a side wall portion, or a bottom-side wall portion and a side wall portion. And in other instances, the retaining wall can only have side wall portions.

In certain embodiments, the wall portions and the surface of the bottom shell can create a cavity. The cavity of the bottom shell can be configured to retain and house the electronic device, and the cavity can be shaped similar to the shape of the electronic device, for instance, so as to be form fitting therewith. In certain embodiments, the cavity of the bottom shell can be shaped to fit a mobile phone. In other instances, the bottom shell can be shaped to fit a tablet computer, a camera, a music player, a GPS device, or the like.

In certain embodiments, the wall portions of the bottom shell can be the same height as the side portions of the electronic device. The wall portions can also be a portion of the height of the side portions of the electronic device. In other embodiments, the wall portions of the bottom shell can only be a small portion of the side portions of the electronic device, only wrapping around the change in surface from the back of the electronic device to the side surface of the electronic device.

As indicated, the elongated body of the bottom shell will have an inner surface and an outer surface. The outer surface can be the surface that a user of the electronic device feels when the electronic device is installed into the protective enclosure. In certain instances, the outer surface of the bottom shell can extend around to the top-side wall portion, the bottom-side wall portion, and/or the side wall portions of the bottom shell. In other embodiments, the outer surface of the bottom shell of the protective enclosure can extend around only the top-side wall portion, only the bottom-side wall portion, only the side portions, or in other embodiments a combination of the wall portions of the bottom shell.

In certain embodiments, the bottom shell of the protective enclosure can have one or more cut out regions. The cut out regions can be located along the left side wall portion and the right side wall portion and/or a top or bottom side wall portion. Accordingly, in other instances, the cut out regions can be located on the top-side wall portion and/or the bottom-side wall portion. The cutouts can be the size of a portion of one of the wall portions of the bottom shell or the cut out regions can be the entire size of one of the wall portions of the bottom shell that the cutout is located. In other instances, one cut out region of the bottom shell can be a different size than another cutout of the bottom shell in the same protective enclosure. The cut out regions of the bottom wall of a protective enclosure can be adapted to accommodate an overmolded material to fill in the cut out regions, such as from a primary and/or secondary cushioning layer, as described herein below. In certain embodiments, the cutouts are located along the left and right side walls of the bottom shell to accommodate a bending of the bottom shell along the elongated body of the bottom shell and/or they may be position along the top and/or bottom side wall portions. In certain embodiments, the bending of the bottom shell can assist with inserting an electronic device into the protective enclosure.

In certain embodiments, the bottom shell of the protective enclosure can have a camera feature and camera opening. The camera feature can include a camera and/or a flash lens portion, and may include an actual lens, and can be located on the outer surface of the bottom shell and in some instances can be aligned with the camera of an electronic device. The camera opening can be the same shape as the camera and/or flash of the electronic device or in certain embodiments can be larger than the size of the camera of the electronic device, and may have a gasket or other configuration to prevent the transmission of light from the flash into the camera lens. In various instances, the perimeter of the case portion encircling the camera feature may at least be partially configured to block light transmission, such as by having a darkened region bordering the circumference of the camera feature portion.

In certain embodiments, the camera feature of the bottom shell can be aligned with the camera of a tablet computer or can be aligned with the lens portion of a camera. The camera feature can be of the same material and color of the bottom shell or in other instances can be a specific color to prevent any distortion of the camera usage of the electronic device when the electronic device is retained in the protective enclosure. In some instances, the color of the camera feature can be black or a dark color.

In certain embodiments, the bottom shell of the protective enclosure can have a protrusion on the inner surface of the bottom shell, such as in the middle center of the surface. The protrusion can be shaped to interact with a feature of the protective enclosure, and in some embodiments can interact with on overmolded layer that fits on the inner surface of the bottom shell of the protective enclosure.

Additionally, in certain embodiments, the protective enclosure can include one or more cushioning layers, such as a first cushioning layer. The first cushioning layer can comprise a front surface and a back surface. In certain embodiments the first cushioning layer can have a proximal portion, a distal portion, and side portions, as well as a front and back surface. In certain embodiments, the first cushioning layer can have an elongated body defined by the shape of the front surface and of the back surface, and may have raised and/or indented sections creating a matrix of surface configurations, so as to help with shock absorbance and/or sound transmission. In various instances, the first cushioning member has a surface that has contoured regions, e.g., raised regions that divide the surface into a plurality of different sub-compartments, wherein each sub-compartment may be of the same shape and/or area or of differing shapes and/or areas.

The back surface of the first cushioning layer of certain embodiments of the protective enclosure can be overmolded onto the inner surface of the bottom shell and create a back portion of the protective enclosure that houses an electronic device. In other embodiments, the first cushioning layer can be overmolded onto the inner surface of the bottom shell along the top-side wall portion, along the bottom-side wall portion, along the left side wall portion and along the right side wall portion, or any variation of the wall portions. In certain embodiments, the front surface of the first cushioning layer can be configured so as to rest against the back surface of the electronic device and provide protection to the electronic device when installed into the protective enclosure. In other embodiments the first cushioning layer can have a depression on the back surface. The depression can interact or engage with the protrusion or nub in the inner surface of the bottom shell. The depression and protrusion can interact to assist with alignment during the overmolding process between the bottom shell and the first cushioning layer of the protective enclosure.

Further, in certain embodiments, the protective enclosure can also include a second cushioning layer. The second cushioning layer can also act as a framework member for the protective enclosure that retains an electronic device. The framework member may be configured so as to include a surface that is surrounded by a perimeter portion. The perimeter portion can be configured to include a perimeter wall. The perimeter wall can include a top wall portion, a bottom wall portion, and opposing side wall portions. In other embodiments, the perimeter portion can only include a top wall portion, or can only include a bottom wall portion, or can only include opposing side wall portions, or any combination of wall portions.

In certain embodiments, the perimeter portion of the framework member can be overmolded with the retaining wall of the bottom shell. In various instances, the perimeter portion of the framework member can be adapted to form-fit over a perimeter portion of the electronic device. The framework member can be formed to create an elevated protective rim around the perimeter of the electronic device, creating a gap between the front face of the electronic device and a surface that the protective enclosure may rest on.

In certain embodiments, the overmolding of the bottom shell, the first cushioning layer, and/or the second cushioning layer can make these components of the protective enclosure inseparable and can make the protective enclosure a one-piece article. In other instances, one or more of these components can remain separate units that are configured so as to be easily assembled, disassembled, and fitted around the device to be protected. In various instances, the second cushioning layer can have an expanded portion along any of the side wall portions of the second cushioning layer. The expanded portions can be overmolded to fit within the cut out regions on the bottom shell and in some embodiments the expanded portions can bend along the perimeter portion of the bottom shell and the second cushioning layer and bend the protective enclosure so as to insert or remove an electronic device more easily.

Hence, in certain embodiments, the framework member can be multiple components that overmold onto the bottom shell. The multiple components can be comprised of a top component, a bottom component, and side components. The protective enclosure can include one or more than one of the individual components of the framework member that overmold onto the bottom wall and comprise the protective enclosure that surrounds and houses the electronic device. The framework member can also be configured to include a plurality of openings. The openings in the framework member or an individual component of the framework member can be located on any wall portion of the framework member and in some instances can be located along the bottom wall portion of the second cushioning layer or framework member. The openings in the framework member can provide access to a component, e.g., a control or sound feature, of the electronic device. In some embodiments, the openings can provide access to a power port, headphone jack port, or a silencing toggle of the electronic device. When the framework member is overmolded with the bottom shell of the protective enclosure, the openings of the framework member or second cushioning layer can be located within the cut out regions of the bottom shell.

In certain embodiments, the framework member can include a sound feature. This sound feature can be located in the same location as the speaker of the electronic device when the electronic device is inserted into the protective enclosure. The sound feature of the framework member can provide access to the sound emitted from the electronic device. In other instances, the sound feature of the framework member, or second cushioning layer, can be located near the volume controls of the electronic device. When the electronic device is housed within the protective enclosure, the sound features of the second cushioning layer can be engaged to interact with the volume controls of the electronic device and volume can be increased or decreased by engaging the sound features of the second cushioning layer.

In certain embodiments, the sound features of the second cushioning layer are located within the cut out regions on the bottom wall when the bottom wall and second cushioning layer are overmolded together as the protective enclosure. By having the sound features located within the cut out regions of the bottom wall, the volume controls are easily engaged thru the second cushioning layer and can be easily depressed in order to change the volume of the electronic device when housed within the protective enclosure.

Hence, in certain embodiments, the second cushioning layer of the protective enclosure can be configured to include a control feature. The control feature can be located on any wall portion of the second cushioning layer, or framework member, and in some instances can be located on a side wall portion. When the electronic device is retained within the protective enclosure, the control feature of the framework member can be located over the power button, volume button, orientation button, etc. of the electronic device. These buttons of the electronic device can then be activated through the framework member, or second cushioning layer, while retaining the electronic device within the protective enclosure. In some embodiments, the control feature of the second cushioning layer can be located within the cut out region of the bottom shell when overmolded together to make the protective enclosure. Having the control feature within the cut out region of the bottom wall allows for the second cushion layer to interact with the power button and engage the button to turn the electronic device, which in some instances can be a mobile phone, on and off.

The details of one or more variations of the subject matter described herein are set forth in the accompanying drawings and the following description. As can be seen with respect to FIG. 1, FIG. 2A, FIG. 2B, FIG. 3A and FIG. 3B, the protective enclosure is one embodiment 100 that can include a one-piece multiple layered case that retains and houses an electronic device. As can be seen with respect to FIG. 9 and FIG. 10, the protective enclosure is one embodiment 900 that can include a one-piece multiple layered case that retains and houses an electronic device. As can be seen with respect to FIG. 11, FIG. 12 and FIG. 13, the protective enclosure is one embodiment 1100 that can include a one-piece multiple layered case that retains and houses an electronic device.

As can be seen with respect to FIG. 1, FIG. 2A, FIG. 2B, FIG. 3A and FIG. 3B, the protective enclosure is one embodiment 100 that can include a one-piece multiple layered case that retains and houses an electronic device. As can be seen with respect to FIG. 9 and FIG. 10, the protective enclosure is one embodiment 900 that can include a one-piece multiple layered case that retains and houses an electronic device. As can be seen with respect to FIG. 11, FIG. 12 and FIG. 13, the protective enclosure is one embodiment 1100 that can include a one-piece multiple layered case that retains and houses an electronic device.

It is to be understood that although particular embodiments are presented herein, such as a protective enclosure for an electronic device, the electronic device comprising a mobile phone, tablet computer, electronic reader, camera or the like, the device housed may be any number of different shapes, sizes, and configurations without departing from the nature of the disclosure. For instance, as herein depicted below, the protective enclosure may include top portions and top wall portions, bottom portions and bottom wall portions, side portions and perimeter portions. In certain instances, (not shown) the protective enclosure cannot have any one of the portions or wall portions listed above or a combination of one or more of the portions listed above. Hence, the scope of the protective enclosures described herein with respect to the particular embodiments set forth in reference to the figures in not intended to be unduly limiting.

Figure 2A:
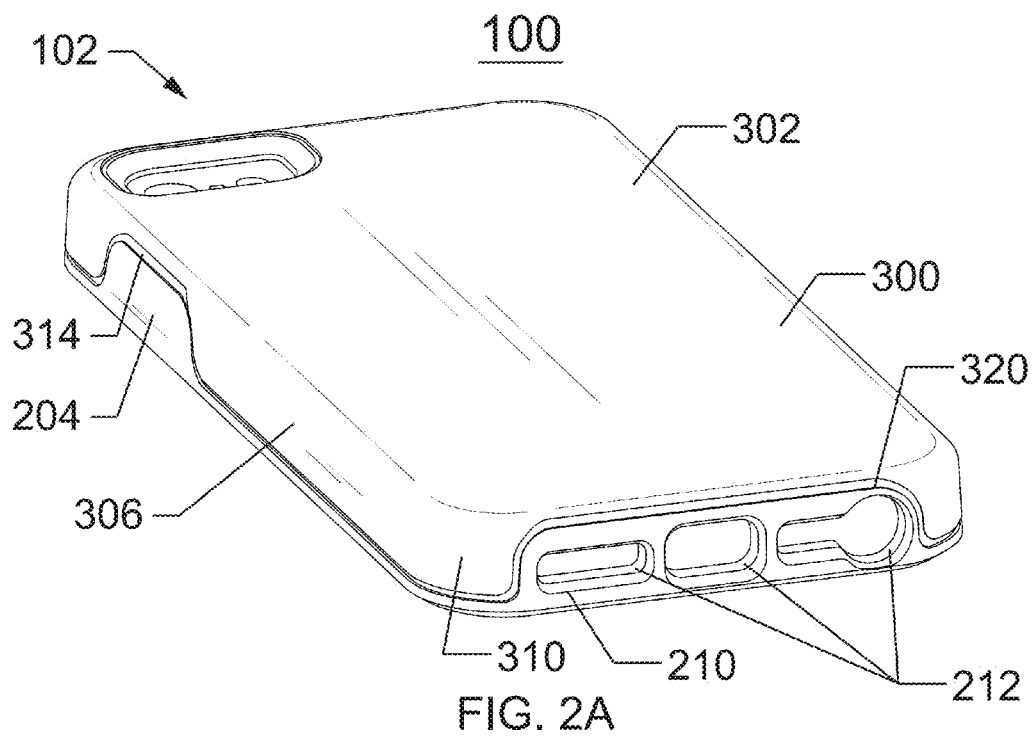
FIG. 2A is a bottom-facing rear isometric view of a protective enclosure for an electronic device.
Figure 2B:
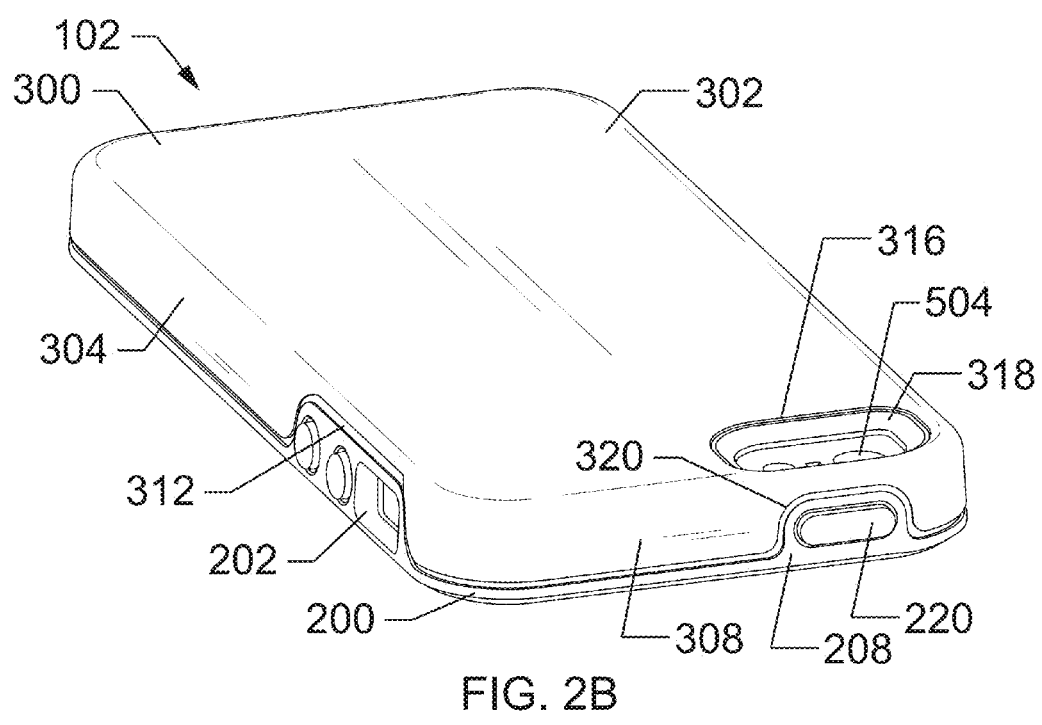
FIG. 2B is a top-facing rear isometric view of a protective enclosure for an electronic device.

Accordingly, with respect to FIG. 1, embodiment 100 is a protective enclosure 102 for an electronic device 500 (not shown). The protective enclosure 102 can include a cushion layer 200 surrounded by a structural layer 300. The structural layer can also be referred to as a bottom shell. The cushion layer 200 and the structural layer 300 can be overmolded to form a one-piece protective enclosure 102 that form-fits to surround an electronic device 500. As can be seen in FIG. 2A and FIG. 2B, the structural layer 300 can have a back portion 302, a left wall portion 304, a right wall portion 306, a top wall portion 308, and a bottom wall portion 310. The structural layer can also be referred to as a bottom shell or shell of the protective enclosure. The wall portions of the structural layer 300 can also be referred to as a retaining wall. The shape and height of the wall portions can vary, but can extend along the shape of the electronic device creating a cavity for the electronic device. The transition between a back portion 302 to a right wall portion 306, a left wall portion 304, a top wall portion 308 and a bottom wall portion 310 of a structural layer can be an edge or a smooth transition.

The structural layer 300 can have a first gap 312 in the left wall portion 304 and can have a second gap 314 in the right wall portion 306. The gaps can also be referred to as cut out regions or cutouts of the structural layer, or bottom shell. The first gap 312 and second gap 314 can span a distance along the left wall portion 304 and the right wall portion 306. In other embodiments, the structural layer can have a first gap and a second gap in a top wall portion and a bottom portion. The gaps in the right wall portion and left wall portion can be located anywhere along the left wall portion and right wall portion. The first gap and second gap can be located in the same location on each wall portion or can be offset from each other on either wall portion.

The material used to create and form the structural layer 300 can be any suitable material such as a thermoplastic polymer or a synthetic polymer. The structural layer 300 can include polycarbonate, nylon, or glass filled nylon. Alternately, any other material, or combination of materials, that provide rigidity to the protective enclosure 102 can be used. The structural layer 300 can be formed using any suitable process, such as and injection molding process. The material used to form the structural layer 300 can be scratch-resistant and can provide a surface on the back portion 302 to add stylistic patterns or images.

The cushion layer 200 can have an interior portion 206, a top portion 208, and a bottom portion 210. The cushion layer 200 can be made of any suitable material such as an elastomer. The elastomer can be a thermoplastic elastomer or silicone rubber. In one embodiment, the cushion layer 200 can be overmolded within a cavity portion of the structural layer 300 and form-fit to the dimensions and size of the electronic device 500. The cushion layer 200 can be overmolded on two or more portions on the structural layer 300 and in one embodiment can define the entire cavity between the structural layer 300 and the electronic device 500.

Figure 4:
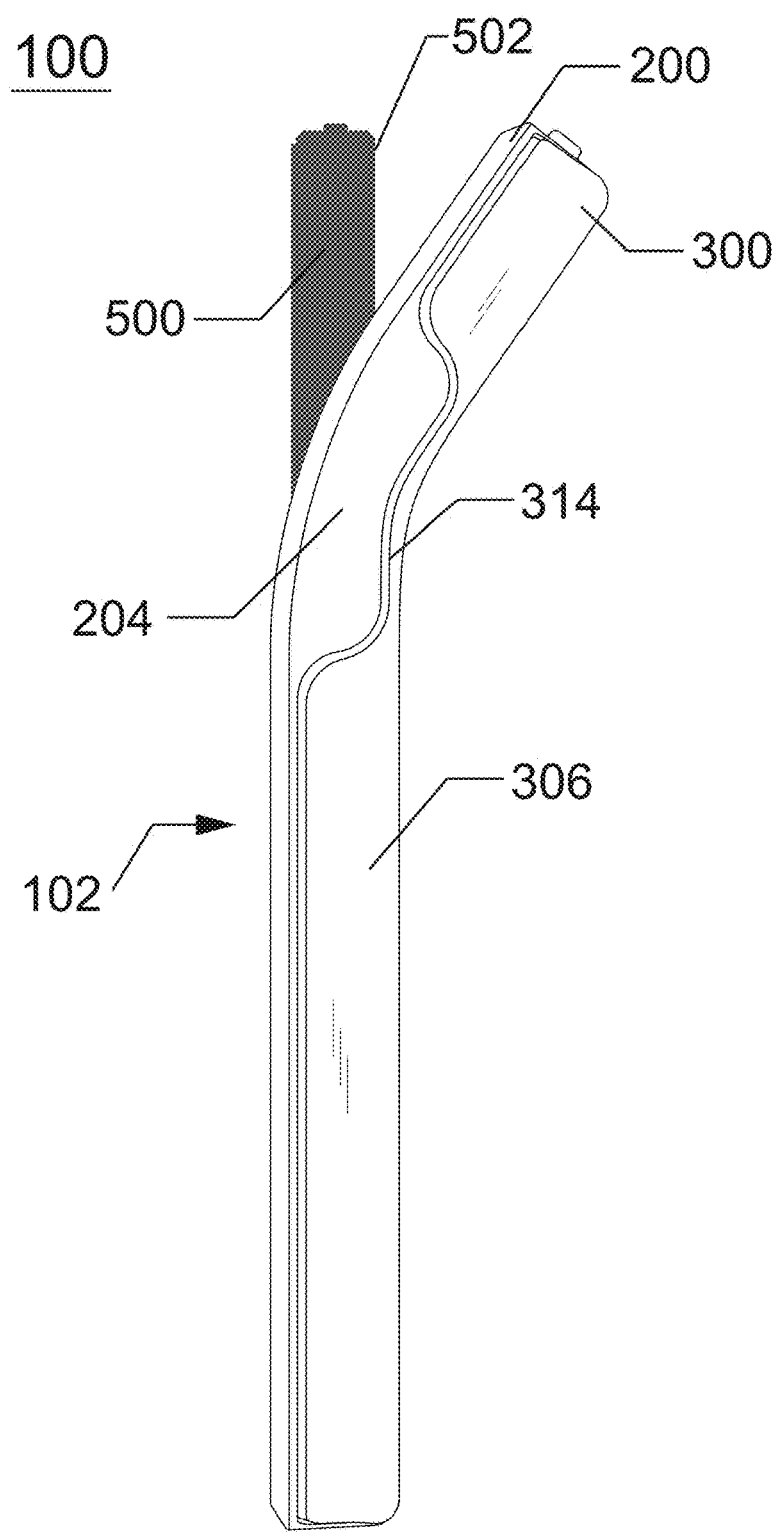
FIG. 4 is a side view of a protective enclosure for an electronic device.

The cushion layer 200 can be overmolded within the cavity of the structural layer 300 and extend across the first gap or cut out region 312 in the left wall portion 304 of the structural layer 300 creating a first flexible wall portion 202 and can be overmolded and extend across the second gap 314 in the right wall portion 306 of the structural layer 300 creating a second flexible wall portion 204. The first and second flexible wall portions of the cushion layer 300 that extend across the gap or cut out regions of the structural layer can also be referred to as an expanded portion of the cushion layer. The cushion layer can have an expanded portion on the left wall portion and have an expanded portion on the right wall portion of the cushion layer that comprises a part of the protective enclosure. The first flexible wall portion 202 and the second flexible wall portion 204 can provide flex and stretch and can allow the back portion 302 of the structural layer 300 to distort away from a back surface 502 of the electronic device 500 for easy insertion and removal of an electronic device 500 from the protective enclosure 102, as shown in FIG. 4.

From the overmolded construction of the structural layer 300 and the cushion layer 200, the protective enclosure 102 provides a one-piece construction that functions like, and provides benefits similar to, a more costly and complicated two-piece or three-piece construction. The protective enclosure 102 provides a soft surface against the electronic device 500 with the cushion layer 200 and also provides a rigidity with the structural layer 300 to protect against impacts and to give the protective enclosure 102 a smooth feel. The structural layer 300 and the cushion layer 200 can be created in a number of variations of color combinations and in some embodiments be transparent for more visual access to the electronic device 500.

The cushion layer 200 and the structural layer 300 can have the same thickness throughout the protective enclosure 102 and in other embodiments can vary in thickness. This thickness can vary depending on the manufacturing process and design of the protective enclosure.

The cushion layer 200 can provide a raised beveled edge 222 to protect the electronic device 500 from direct contact with surfaces while in the protective enclosure 102. The raised beveled edge 222 of the cushion layer can also be referred to as an elevated protective rim. The raised beveled edge 222 of the cushion layer 200 can surround the left wall portion 304, the right wall portion 306, the top wall portion 308, and the bottom wall portion 310 of the structural layer 300 or in other embodiments can be a sectional raised beveled edge extending from one or more wall portions. In other embodiments, the raised beveled edge can be formed from the structural layer to protect the surface of the electronic device.

The first gap or cut out region 312 and the second gap or cut out region 314 of the structural layer 300 can be located along any part of the left wall portion 304 and the right wall portion 306. In one embodiment the first gap 312 and the second gap 314 are located closer to the top wall portion 308 of the structural layer 300 as shown in FIG. 2. In another embodiment, the first gap 312 and the second 314 can be located closer to the bottom wall portion of the structural layer 300.

The cushion layer 200 can provide openings 212 and the structural layer 300 can provide openings 320 for access to features of the electronic device 500. These features can include the power cable access, speaker access, microphone access, and headphone jack access. The openings 200 and 320 can be a general opening or can be formed openings to mimic the feature that they are providing access to on the electronic device 500 for greater protection of the electronic device 500, as shown in FIG. 2.

The structural layer 300 can provide openings 320 for the cushion layer 200 to provide functional coverings 220 for the electronic device 500. These functional coverings of the cushion layer can also be referred to as control features and in some instances can be referred to as sound features. These functional coverings 220 can include the power button and volume buttons. The functional coverings 220 can have flexible properties due to the material structure of the cushion layer 200. The protective enclosure 102 is designed to provide access to all features of the electronic device 500 with the openings 320 and 212 and functional coverings 220 so that a user does not need to remove the electronic device 500 from the protective enclosure 102 in order to use the features of the electronic device 500.

The cushion layer 200 can provide a camera opening 214 for the electronic device 500. The structural layer 300 can have a camera opening 316 that mimics the shape of the camera opening 214 in the cushion layer 200 for access to the camera 504 of the electronic device 500, as shown in FIG. 2. The camera opening 316 of the structural layer 300 can have a printed surface 318 that surrounds the camera opening 316 and does not hinder the color accuracy of the camera 504 while the electronic device 500 is installed in the protective enclosure 102. In one embodiment, the color of the printed surface 318 is black. In other embodiments, the printed surface 318 can be other dark colors.

The cushion layer 200 can have an interior portion 206 that lines the cavity created by the back portion 302 of the structural layer 300. The interior portion 206 can have raised portions 216 and sunken portions 218, as shown in FIG. 1 and FIG. 3. The raised and sunken portions of the interior portion of the cushion layer can be located on a front surface and a back surface of the cushion layer. These raised portions 216 and sunken portions 218 can provide an air gap between sections the interior portion 206 of the cushion layer 200 and a back surface 502 of an electronic device 500. The air gaps between the sunken portions 218 of the cushion layer 200 and the back surface 502 of the electronic device 500 can provide extra cushion protection for the electronic device 500 while it is surrounded by the protective enclosure 102. In other embodiments, raised portions and sunken portions on the interior portion of the cushion layer can be along the walls of the protective enclosure.

In one embodiment 100, a slot 402 can be created where the parting area 400 of the structural layer 300 and the cushion layer 200 overmold together to form the protective enclosure 102. The slot 402 can be an area that aids in manufacturing for the overmold to have a clean shutoff region and the slot 402 can hide potential flash created during manufacturing. The slot 402 can be used as a visual effect for the protective enclosure 102 and the slot 402 can also be used as a track for sliding on other accessories or components to the protective enclosure. The slot 402 can be formed along any wall portion or perimeter portion of the structural layer and of the cushion layer. The slot 402 can extend around the entire perimeter portion of the protective enclosure or extend around only a portion of the perimeter portion. The slot 402 can also extend for a distance around the perimeter portion and stop, and then start again at another location around the perimeter portion of the structural layer and cushion layer. Other accessories can include mounts and battery accessories to aid in the use of the electronic device within the protective enclosure. Slot 402 can be a thickness and depth of 0.10 in, and can vary in thickness and depth depending on the manufacturing process and design. In other embodiments, the parting area between the structural layer and the cushion layer can be a smooth transition.

Figure 5:
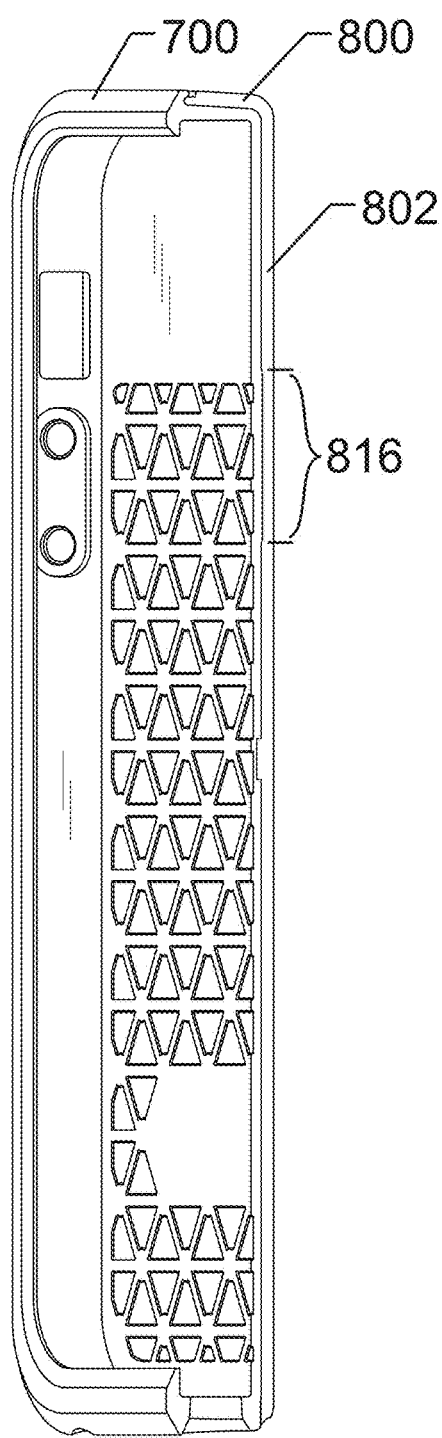
FIG. 5 is a front isometric section view of a protective enclosure for an electronic device.
Figure 6:
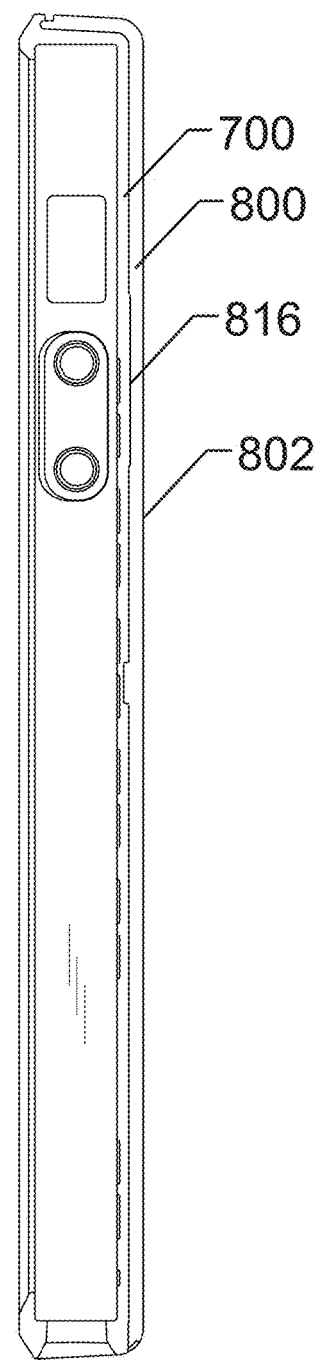
FIG. 6 is a side section view of a protective enclosure for an electronic device.
Figure 7:
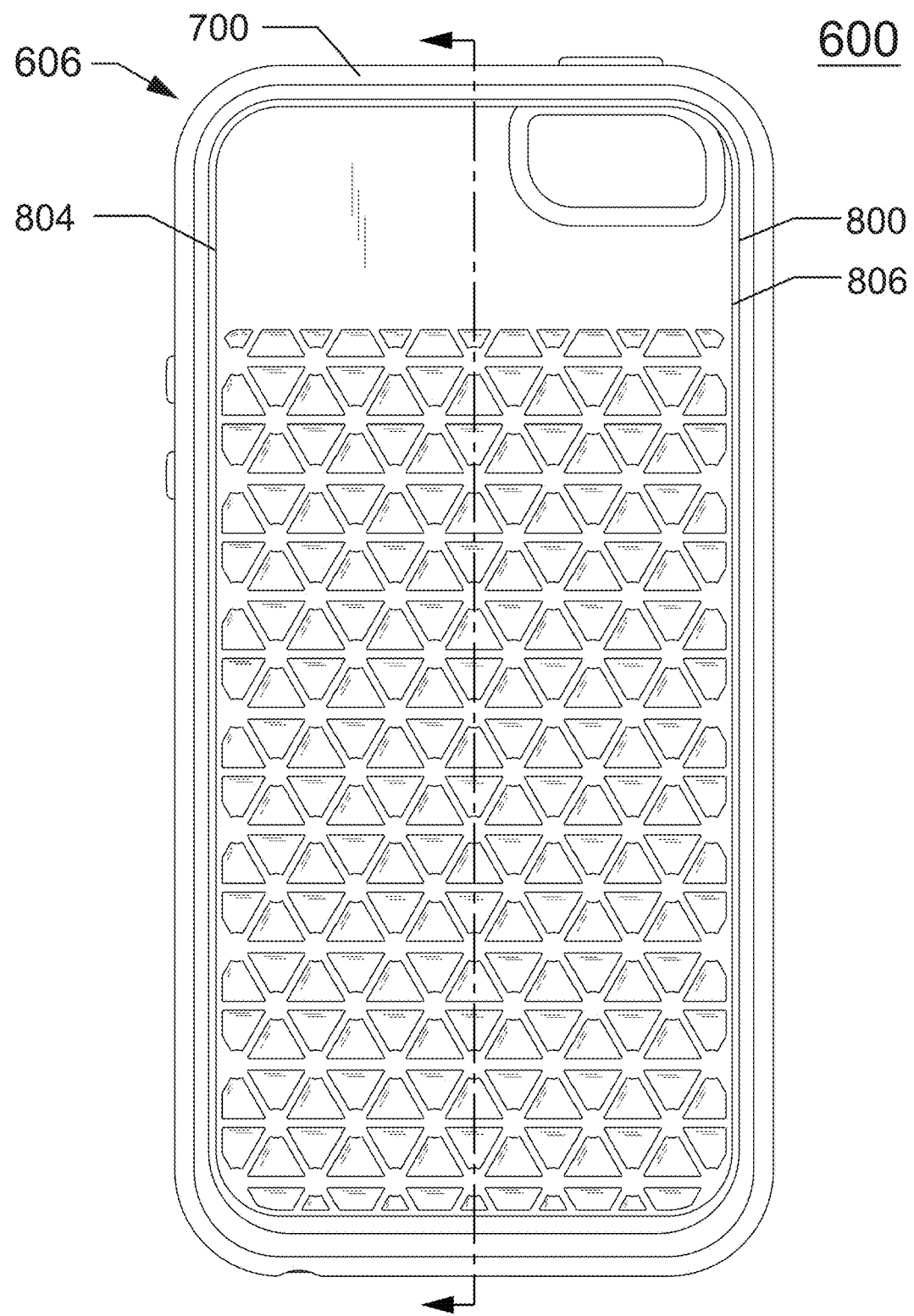
FIG. 7 is a front view of a protective enclosure for an electronic device.

In embodiment 600 on shown in FIG. 5 and FIG. 6, a cushion layer 700 can be overmolded within the cavity of the structural layer 800. The structural layer can also be referred to as a bottom shell. The back portion 802 of the structural layer 800 can have a thinner portion 816 that spans along the back portion 802 of the structural layer. The thinner portion 816 can extend along the back portion 802 of the structural layer 800 from the left wall portion 804 of the structural layer 800 to the right wall portion 806 of the structural layer 800. In some embodiments, the thinner portion 816 can extend only a portion of the distance along the back portion 802 of the structural layer. In even other instances, the thinner portion 816 can comprise multiple portions of the back portion, the multiple portions extending along the back portion 802 of the structural layer 800.

Figure 8A:
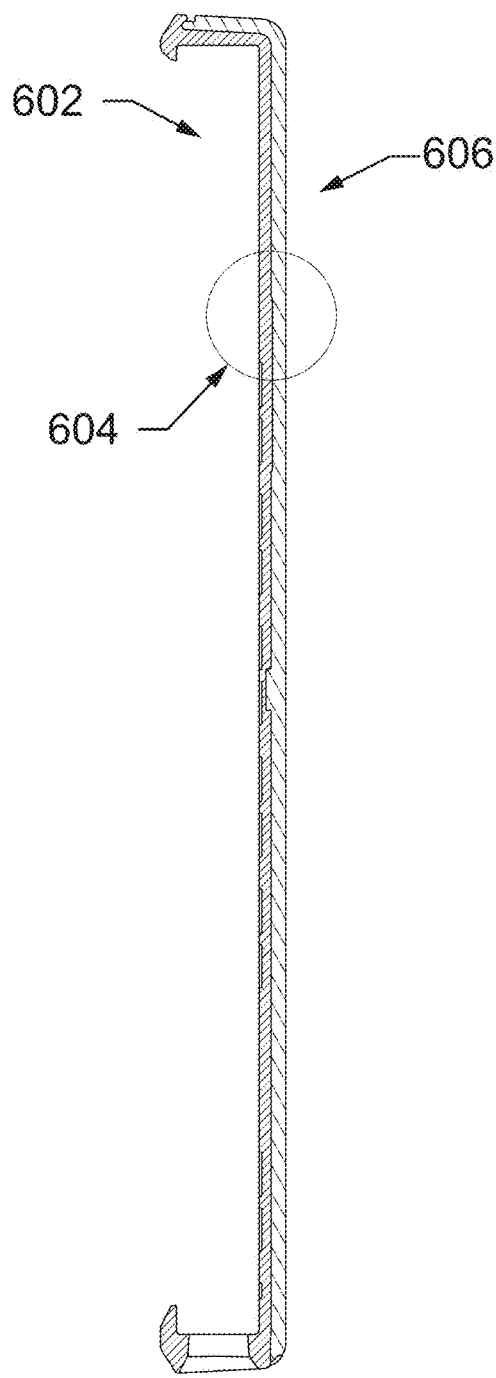
FIG. 8A is a side section view of a protective enclosure.
Figure 8B:
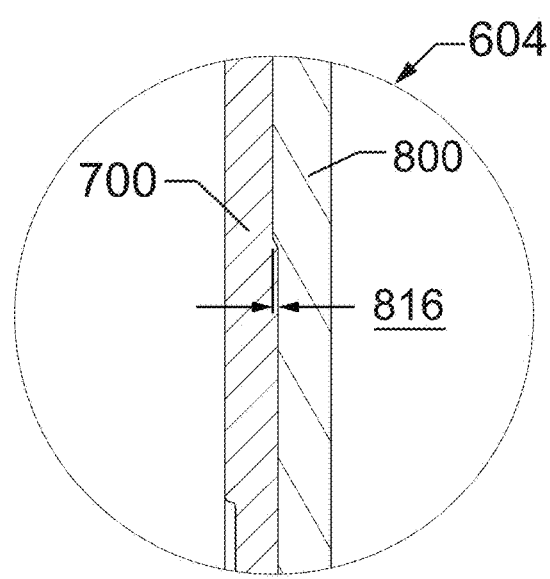
FIG. 8B is an enlarged section view from FIG. 8A.

As shown in the cross-section view 602 and the enlarged view 604 of FIG. 8A and FIG. 8B, the thinner portion 816 of the back portion 802 of the structural layer 800 can be 0.01 in. thinner than the other parts of the structural layer. This portion can be greater or smaller than 0.01 in. In other embodiments, the back portion of the structural layer does not have a thinner portion and can have a uniform thickness along the back portion of the structural layer and from left wall portion and the right wall portion of the structural layer.

The thinner portion 816 of the back portion 802 of the structural layer can be located anywhere along the back portion. In embodiment 600 the thinner portion 816 is located closer to the top portion of the protective enclosure 606 than the lower portion. In other embodiments, the thinner portion of the back portion of the structural layer can be located within the first gap and second gap of the structural layer and within the first flexible wall portion and second flexible wall portion of the cushion layer. The thinner portion of the back portion of the structural layer can assist with flexing of the back portion of the structural layer when the flexible wall portions of the cushion layer are stretched to distort the back portion of the structural layer for ease in inserting and removing an electronic device.

Figure 9:
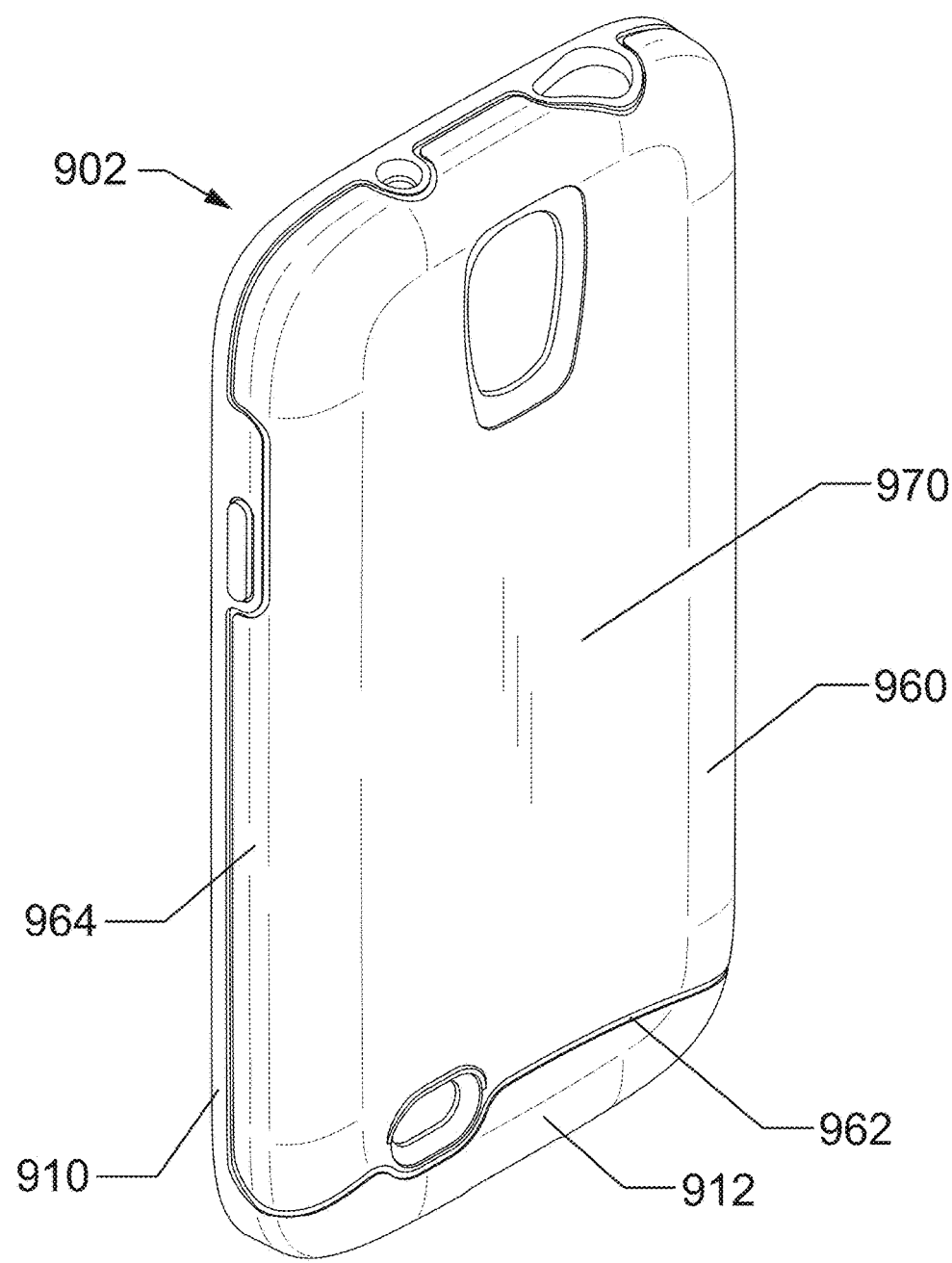
FIG. 9 is a rear perspective view of a protective enclosure for an electronic device.

Embodiment 900, shown on FIG. 9 is a protective enclosure 902 for an electronic device. The protective enclosure 902 can include a cushion layer 910 surrounded by a structural layer 960. The structural layer can also be referred to as a bottom shell. The cushion layer 910 and the structural layer 960 can be overmolded to form a one-piece protective enclosure 902 that form-fits to surround an electronic device.

The structural layer 960 can have a back portion 970, a left wall portion 964, a right wall portion 966, and a top wall portion 968. The back portion 970 can also be referred to as an elongated body that includes an inner surface and an outer surface. The left wall portion of the structural layer can also be referred to as a left side wall portion. The right wall portion 966 of the structural layer 960 can also be referred to as a right side wall portion. The top wall portion 968 can also be referred to as a top-side wall portion. The shape and height of the wall portions can vary, but can extend along the shape of the electronic device creating a cavity for the electronic device. The structural layer 960 can have a gap 962 between the left wall portion 964, the right wall portion 966 and the back portion 970. The gap 962 can also be referred to as a cut out region and in some instances can be referred to as cutouts of the structural layer or bottom shell.

The cushion layer 910 can be overmolded on two or more portions on the structural layer 960 and the cushion layer 910 can extend from the left wall portion 964, the right wall portion 966 and the back portion 970 of the structural layer 960 to form a bottom flexible wall portion 912. The bottom flexible portion can also be referred to as an expanded portion of cushion layer. This bottom flexible wall portion 912 can be flexible enough to bend and extend towards the back portion 970 of the structural layer 960 and away from an electronic device within the protective enclosure 902 for ease of insertion and removal of the electronic device to and from the protective enclosure 902.

In another embodiment, the cushion layer of the protective enclosure can be separated into two members. In even other embodiments, the cushion layer of the protective enclosure described herein could be separated into more than two members. These multiple members of the cushion layer can then be overmolded to the structural layer, or bottom shell, and continue to act as a cushion layer to protect the electronic device when inserted into the protective enclosure from drops, falls, scratches, dents, and other damage.

As seen in FIG. 11-FIG. 16, Embodiment 1100 illustrates a protective enclosure 1102 for an electronic device 1000 (not shown). The protective enclosure 1102 includes a bottom shell 1200. The bottom shell can include an elongated body 1202 that has an inner surface 1204 and an outer surface 1206. The inner surface 1204 and the outer surface 1206 can create an elongated body 1202 of the bottom shell 1200. The elongated body 1202 including the inner surface 1204 and the outer surface 1206 are surrounded by a perimeter portion 1224.

The perimeter portion 1224 of the bottom shell 1200 defines a retaining wall 1208. The retaining wall 1208 is formed by a top-side wall portion 1210, a bottom-side wall portion 1212, a left side wall portion 1214, and a right side wall portion 1216. The bottom shell can be formed from a rigid or semi-rigid material, such as polycarbonate material. The bottom shell 1200 can also include a nylon or glass-filled nylon.

The bottom shell 1200 can include a cut out region 1218. The cut out region can also be referred to as cutout or a gap in the bottom shell 1200. The cut out region or more than one cut out region 1218 can be located along the right side wall 1210 and left side wall portion 1214 of the retaining wall 1208. The cut out region 1218 can comprise the entire height of the left side wall portion 1214 and right side wall portion 1216 or can be a portion of the height of the left side wall portion 1214 and right side wall portion 1216. The cutout region 1218 can extend along the left side wall portion 1214 and right side wall portion 1216 and can include a region of access to volume controls 1008 (not shown), and power control 1010 (not shown) of the electronic device 1000 when the electronic device is housed within the protective enclosure 1102.

The cutouts 1218 can also be located along the top-side wall portion and along the bottom-side wall portion. The cutouts 1218 can be only located on the top-side wall portion, the bottom-side wall portion, left side wall portion and right side wall portion or a plurality of cutouts 1218 can be located on any of the wall portions of the bottom shell 1200.

The bottom shell 1200 of the protective enclosure 1102 can include a camera feature 1220. The camera feature 1220 can be provided on the outer surface 1206 of the bottom shell 1200. The camera feature 1220 can include a camera opening 1222, the camera opening 1222 extending from the outer surface 1206 of the bottom shell 1200 to the inner surface 1204 of the bottom shell 1200. The camera feature can comprise the same material as the bottom shell 1200 and can comprise a dark color along the camera feature 1220. The dark color assists with not interfering with the camera functions of the electronic device 1000 when housed within the protective enclosure 1102.

Figure 15:
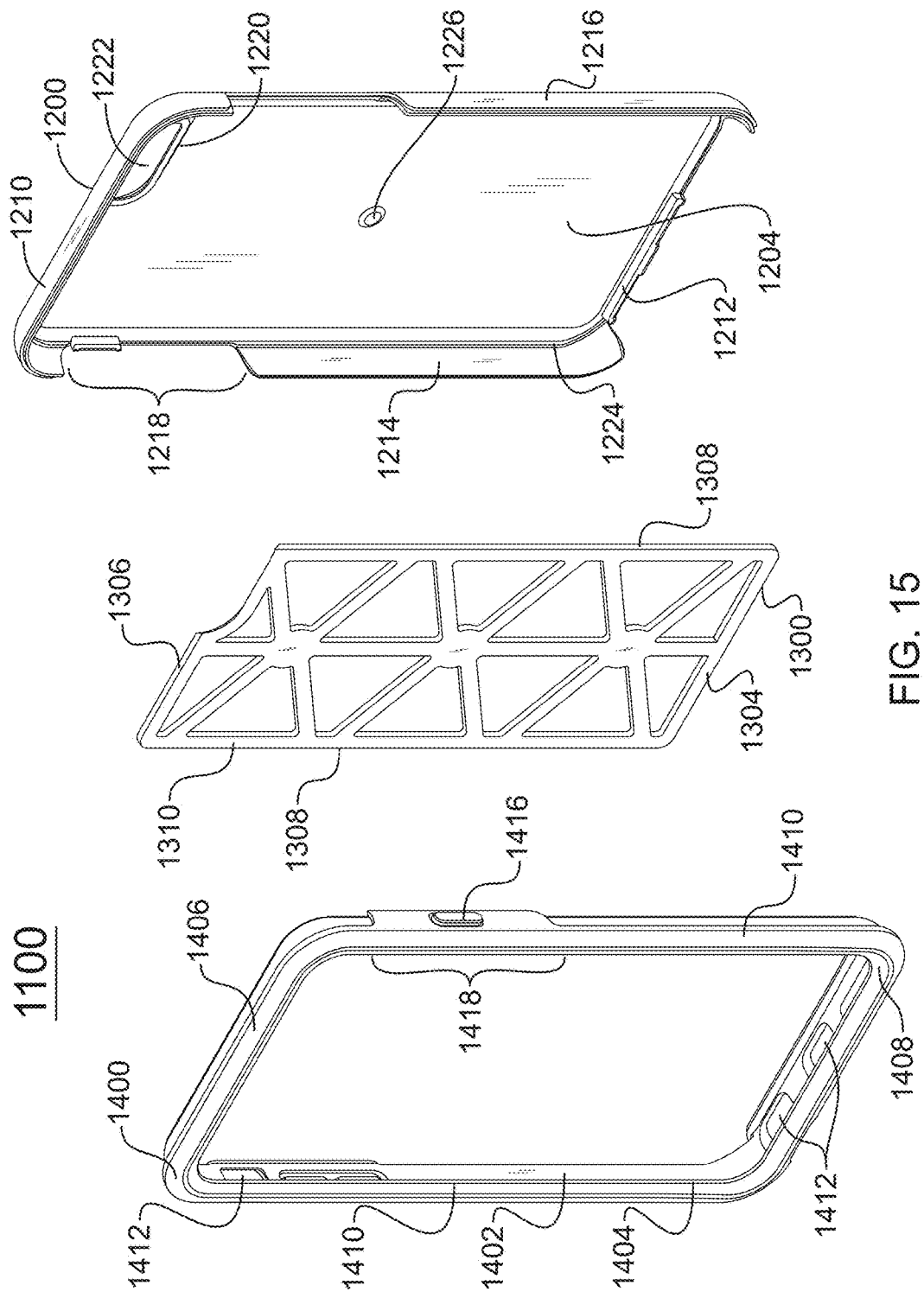
FIG. 15 is a front isometric exploded view of a protective enclosure for an electronic device.

The bottom shell 1200 of the protective enclosure 1102 can include a protrusion 1226. The protrusion 1226 can be located on the inner surface 1204 of the bottom shell 1200 and extend away from the inner surface 1204. The protrusion 1226 can be any size and shape and be located anywhere on the inner surface 1204 of the bottom shell 1200. FIG. 15 shows the protrusion 1226 centered in between the left side wall portion 1214 and the right side wall portion 1216 and centered between the top-side wall portion and bottom-side wall portion of the bottom shell 1200.

The protective enclosure 1102 of embodiment 1100 can also include a first cushioning layer 1300. The first cushioning layer 1300 can comprise an elongated body 1302 defined by a proximal portion 1304, a distal portion 1306, and side portions 1308. The first cushioning layer can have a front surface 1310 and a back surface 1312.

Figure 12:
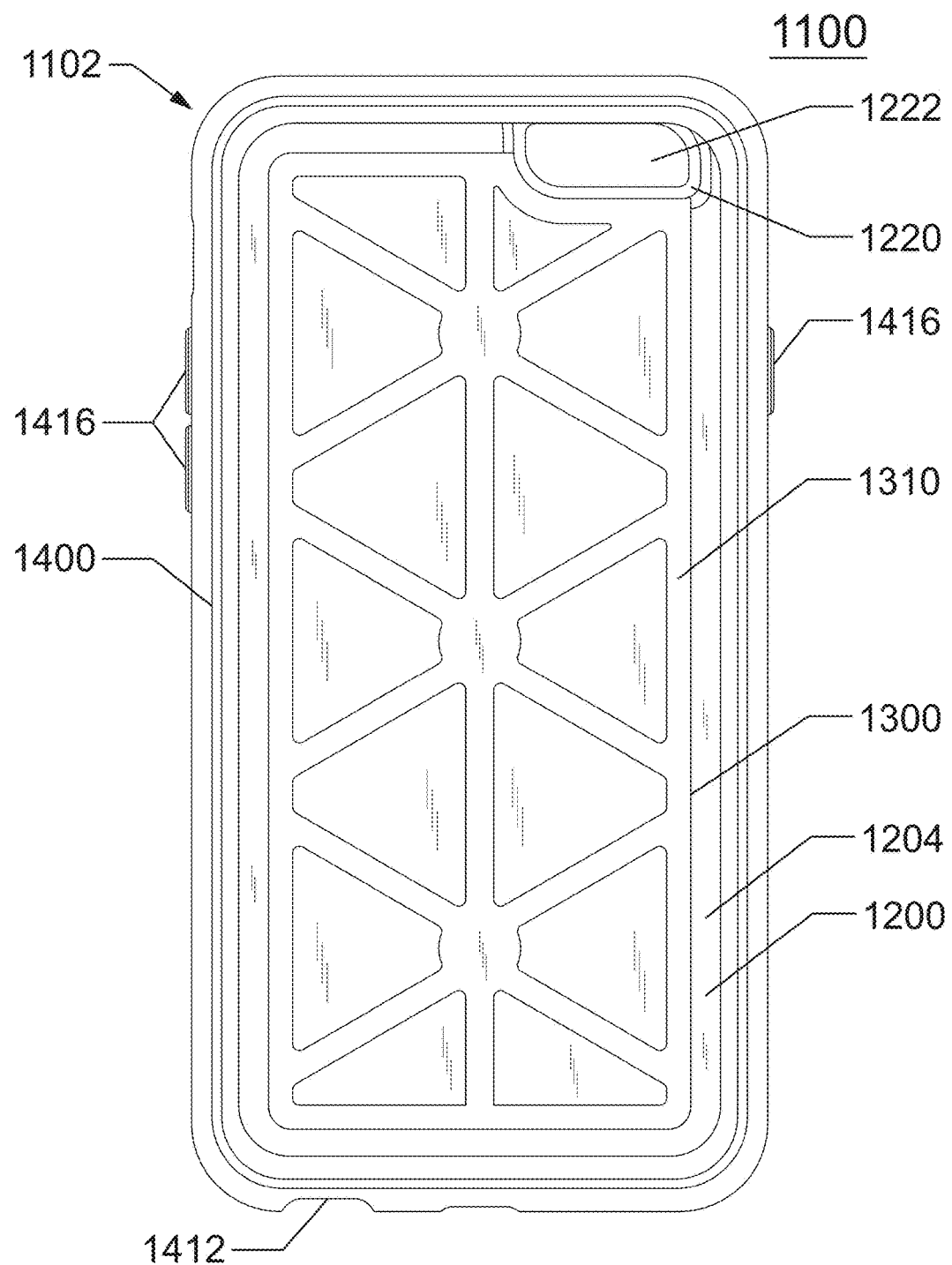
FIG. 12 is a front view of a protective enclosure for an electronic device.

When utilized as part of the protective enclosure 1102, the first cushioning layer 1300 can be overmolded onto the bottom shell 1200 of the protective enclosure 1102. The back surface 1312 of the first cushioning layer 1300 can be overmolded to the inner surface 1204 of the bottom shell 1200. The first cushioning layer 1300 can mimic the shape of the inner surface 1204 of the bottom shell 1200. The first cushioning layer 1300 can be the same size as the perimeter portion 1224 of the bottom shell 1200. In some instances the first cushioning layer 1300 can be smaller in size than the shape of the inner surface 1204 of the bottom shell 1200. As shown in FIG. 12, the first cushioning layer 1300 mimics the shape of the inner surface 1204 but is smaller in size of the inner surface 1204 of the bottom shell 1200.

The first cushioning layer 1300 can extend along the back surface 1004 of an electronic device 1000 (not show), protecting the back surface within the protective enclosure 1102. The first cushioning layer 1300 can be a solid component or can have openings throughout the elongated body 1302. The openings can make the first cushioning layer 1300 lighter in weight when overmolded in the protective enclosure 1102. The openings of the first cushioning layer 1300 can also be configured to act as a skeletal frame for added shock and drop protection when the electronic device 1000 is retained and housed in the protective enclosure 1102.

The first cushioning layer can be composed of a flexible material, such as TPE, to function as a layer within the protective enclosure 1102 that can absorb shock away from the electronic device 1000 due to impact or a drop. The first cushioning layer can be any color or texture, and can vary in color and texture from the bottom shell.

Figure 16:
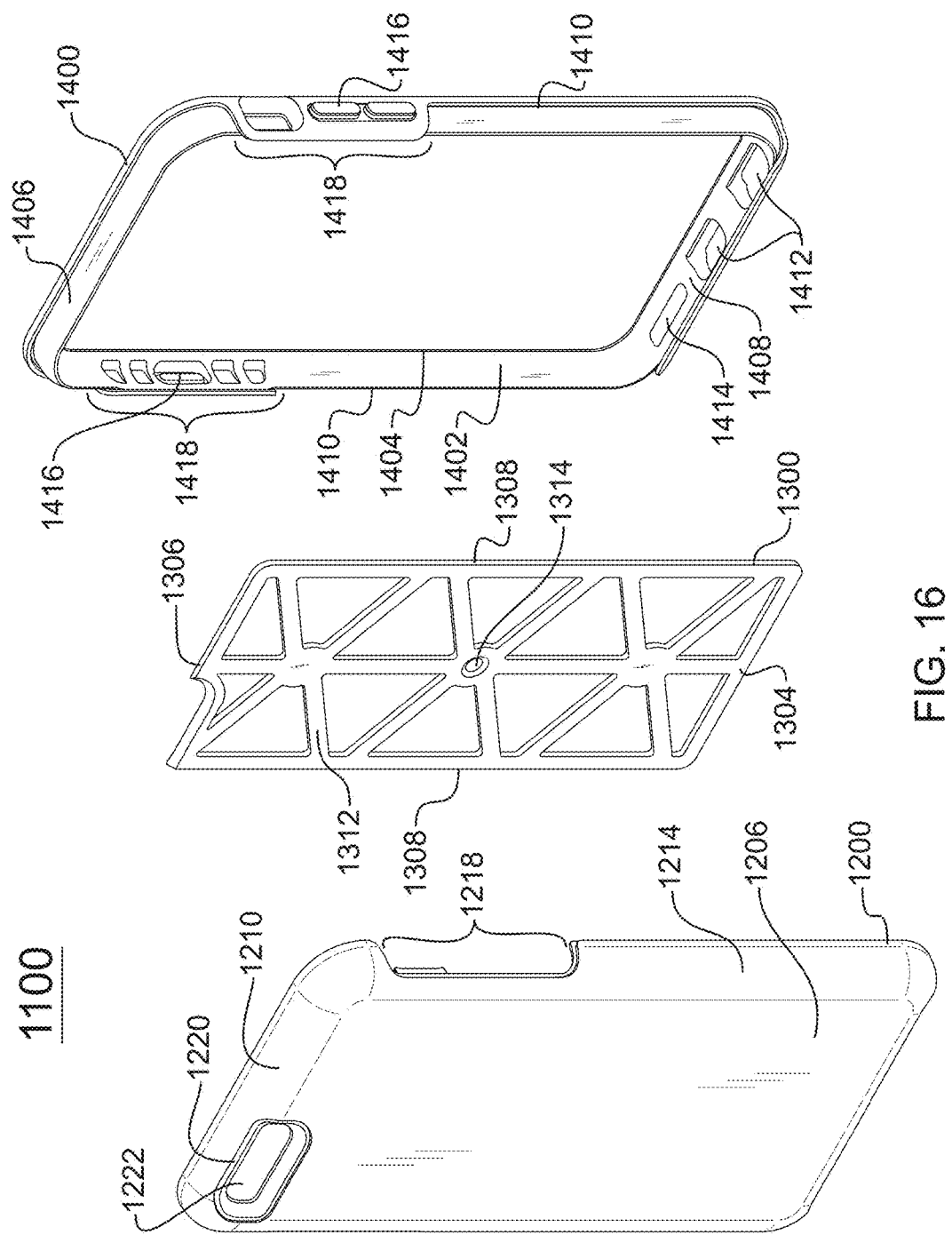
FIG. 16 is a rear isometric exploded view of a protective enclosure for an electronic device.

The first cushioning layer 1300 includes a depression 1314. The depression can be located on the back surface 1312 of the first cushioning layer 1300. The depression 1314 can be any size and shape and as shown in FIG. 16 the depression can be the exact opposing size and shape of the protrusion 1226 of the bottom shell 1200. The depression 1314 of the first cushioning layer 1300 and the protrusion 1226 of the bottom shell 1200 can act as a guide or set point for the protective enclosure 1102 during assembly, ensuring that the bottom shell 1102 and the first cushioning layer 1300 overmold in the correct position for the protective enclosure 1102 to properly protect the electronic device 1000.

The protective enclosure 1102 of embodiment 1100 can also include a second cushioning layer 1400. The second cushioning layer can also be referred to as a framework member. The framework member 1400 can include a surface 1402 defining a perimeter portion 1404 of the framework member 1402. The perimeter portion 1404 can include a top wall portion 1406, a bottom wall portion 1408, and side wall portions 1410. The top wall portion 1406, the bottom wall portion 1408 and the side wall portions 1410 can be of any length and in the protective enclosure 1102 can be the same size and shape as the wall portions of the bottom shell 1200. The wall portions of the bottom shell 1200 and the wall portions of the framework member 1400 can then form-fit to the size and shape of the wall portions of an electronic device 1000.

Figure 10:
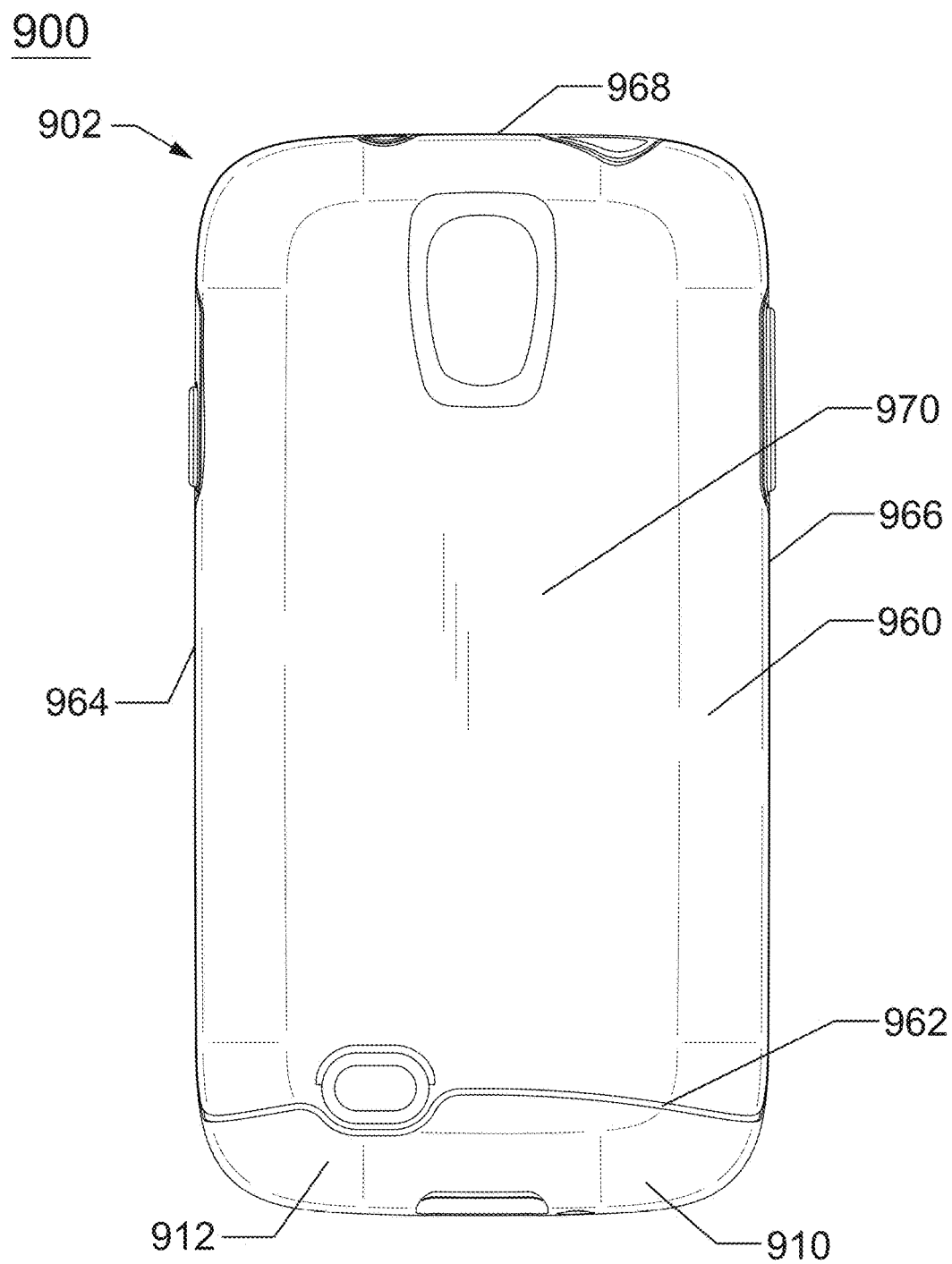
FIG. 10 is a rear perspective view of a protective enclosure for an electronic device.

The framework member 1400 can be overmolded to the back shell 1200, where the top wall portion 1406 of the framework member 1400 overmolds to the top-side wall portion 1210 of the retaining wall 1208 of the bottom shell, the bottom wall portion 1408 of the framework member 1400 overmolds to the bottom-side wall portion 1212 of the retaining wall 1208 of the bottom shell 1200, the side wall portions 1410 of the framework member 1400 overmold to the left side wall portion 1214 and the right side wall portion 1216 of the retaining wall 1208 of the bottom shell 1200. A combination of only some the above overmolded portions can also be included in some instances. For example, FIG. 10 shows protective enclosure 902 in which no overmolding occurs along the bottom flexible wall portion 912 of the protective enclosure 900.

The perimeter portion 1404 of the framework member can be overmolded and designed to extend above a front surface of the electronic device 1000 when the electronic device is housed and retained in the protective enclosure 1102. By extending beyond and above a front surface of the electronic device 1000, the protective enclosure 1102 can protect the capacitive sensing touch screen of the electronic device. The perimeter portion 1404 can extend beyond the front surface of the electronic device 1000 around the entire perimeter of the front surface of the electronic device or can extend above the front surface in only certain regions, leaving other regions to be flush with the front surface of the electronic device.

The framework member 1400 can include one or more expanded portions 1418. The expanded portions can also be referred to as flexible wall portions. The expanded portions 1418 can be of the same thickness as the wall portions of the framework member 1400 or can be of a reduced thickness compared to the thickness of the wall portions of the framework member 1400.

Figure 13:
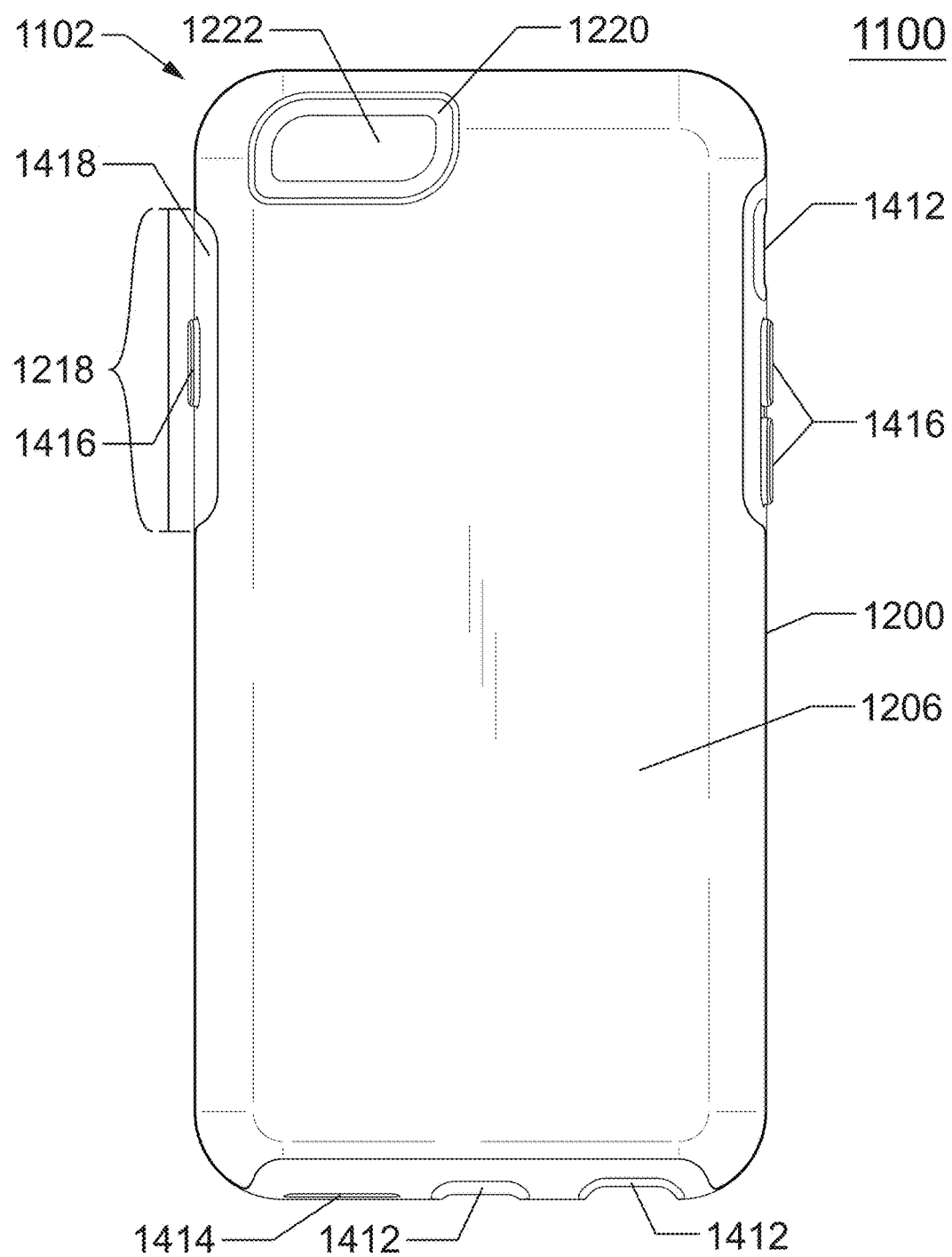
FIG. 13 is a rear view of a protective enclosure for an electronic device.
Figures 14A, 14B:
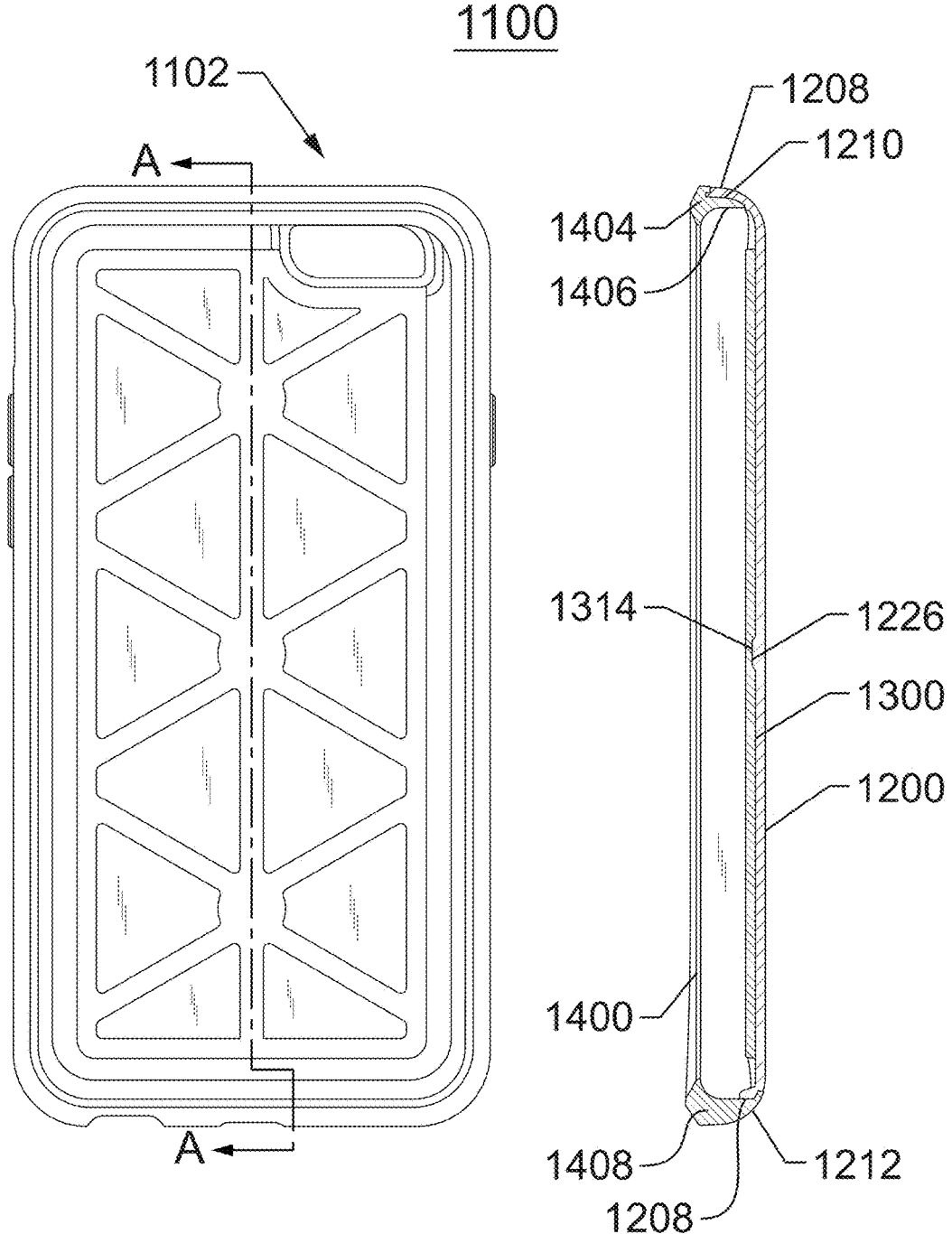
FIG. 14A is a front view of a protective enclosure for an electronic device.
FIG. 14B is a section side view from FIG. 14A.

The expanded portions 1418 can be located along the side wall portions 1410 of the framework member 1400. In other instances, the expanded portions can be located on the top wall portion and/or the bottom wall portion. In protective enclosure 1102 when the framework member 1400 is overmolded with the retaining wall 1208 of the bottom shell 1200, the expanded portions 1418 of the framework member 1400 are located in the same location as the cut out regions 1218 of the bottom shell 1200. FIG. 13 illustrates the expanded portion 1418 of the framework member 1400 overmolded in the same region at the cutouts 1218 of the bottom shell 1200. When overmolded together, the cutout region 1218 and expanded portion 1418 create a flush interaction that matches the thickness of the other regions of the protective enclosure 1102 where the bottom shell 1200 and framework member 1400 have been overmolded together.

FIG. 4 depicts an example of how the protective enclosure 102 (or 1102) functions to insert and remove an electronic device 500 (or 1000). With respect to the protective enclosure 1102, the cut out regions 1218 of the bottom shell 1200 and the expanded portion 1418 of the framework member are overmolded together in the top-half region on the protective enclosure 1102 (shown as 102). The cut out regions 1218 are similar to and depicted as the second gap 314 of the structural layer 300 and the expanded portion 1418 is depicted as the second flexible portion 204 of the cushion layer 200. When pressure is asserted against the top portion 208 and top wall portion 308 of the protective enclosure 102, the protective enclosure 102 can bend away from the electronic device 500, allowing the electronic device to be inserted or removed from the protective enclosure. The top portion 208 is similar to the top wall portion 1406 of the protective enclosure 1102 and the top wall portion 308 of protective enclosure 102 is similar to the top-side wall portion 1210 of the retaining wall 1208 of the protective enclosure 1102.

Figure 11:
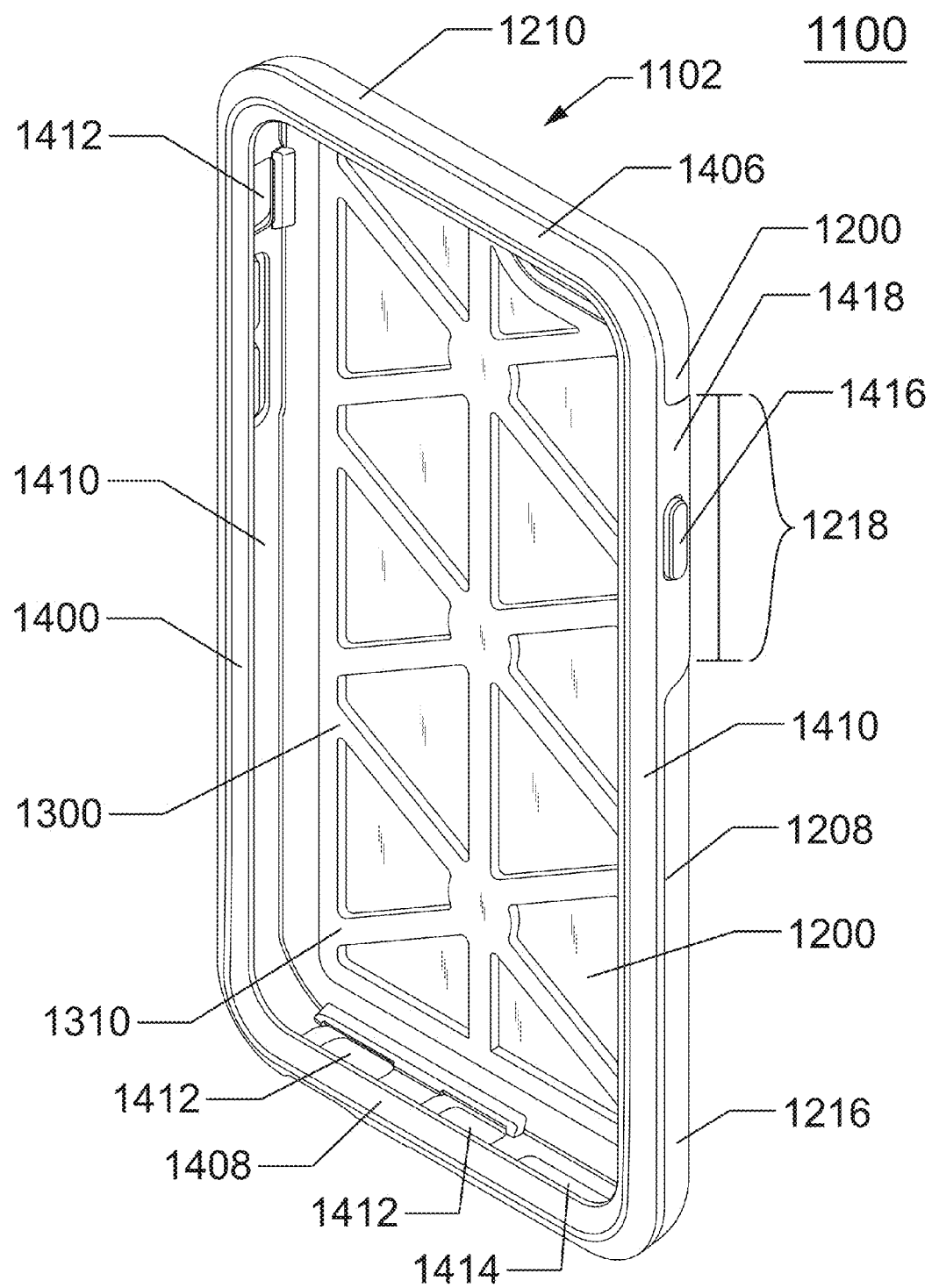
FIG. 11 is a front isometric view of a protective enclosure for an electronic device.

The framework member 1400 can include a plurality of openings 1412. The openings can be located along any of portions of the framework member 1400, including the top wall portion 1406, the bottom wall portion 1408, and the side wall portions 1410. As can be seen in FIG. 11 and FIG. 13, the openings 1412 can be located along the wall portions of the framework member 1400 where the cut out regions 1218 are located in the bottom shell 1200 when the framework member 1400 is overmolded to the bottom shell 1200 of the protective enclosure 1102. The openings 1412 can provide access to functional aspects of the electronic device 1000 when the electronic device is housed and retained within the protective enclosure 1102. Functional aspects of the electronic device can include a power control switch, a power access port for charging the electronic device, a headphone jack port, and the like.

The openings 1412 of the second cushioning layer or framework member 1400 can be the same size as the functional aspect of the electronic device that the opening 1412 is aligned with when the electronic device 1000 is housed and retained in the protective enclosure 1102 and in some instances the openings 1412 can be a larger size. A larger size of an opening 1412 can accommodate multiple sizes of accessories needed to interact with the electronic device 1000 housed and retained in the protective enclosure 1102. Headphone jacks can be of different sizes, can be power cords and can be plugs of different sizes, all desired to be accommodated using the protective enclosure 1102 for the electronic device.

In other instances, the openings 1412 can have flaps or tabs that connect to the wall portions of the framework member and fold over and seal the opening 1412 to keep dust and water away from the functional aspects of the electronic device while housed and encased in the protective enclosure 1102. In even other instances, separate plugs can be available to seal and close the openings 1412, the plugs not being connected to the protective enclosure when not in place.

The framework member 1400 can include one or more sound features 1414. The sound feature can be located on any one of the wall portions of the framework member 1400 and a plurality of sound features can be comprised along the wall portions of the framework member 1400. In one instance, a sound feature 1414 can be located along the bottom wall portion 1408 of the framework member 1400. The sound feature 1414 aligns with the speaker of an electronic device when the electronic device is housed and retained in the protective enclosure 1102. The sound feature 1414 can assist in amplifying the sound from the electronic device through the protective enclosure 1102.

The sound feature 1414 can be located on the side wall portion 1410 of the framework member. The sound feature 1414 can be comprised of a flexible material that can flex when pushed or depressed. The sound feature 1414 can be located along a portion of the electronic device where the volume control buttons are located. When the electronic device is housed and retained in the protective enclosure 1102, the sound feature 1414 can cover the volume controls of the electronic device and allow depression and activation of the volume controls through the framework member 1400 of the protective enclosure 1102. One or more sound features 1414 can be located over the volume controls of the electronic device for increasing or decreasing the volume of the electronic device.

The framework member can include one or more control features 1416. The control features can be located on any of the wall portions of the framework member 1400. In one instance a control feature 1416 can be located along the side wall portion 1410 of the framework member 1400 and along the cut out region 1218 of the bottom shell 1200 when the framework member 1400 is overmolded to the bottom shell 1200 of the protective enclosure 1102. When the control feature 1416 is located along the cut out region 1218 of the bottom shell 1200, the control features 1416 can interact with buttons and control buttons of the electronic device. These buttons can include a power switch, can include a volume control, can include a silence toggle button, and the like. The control feature 1416 can be of the same material as the framework member 1400 or can be an overmolded material that is more or less flexible than the framework member 1400. The flexible material of the control feature 1416 allows for activation of a button on the electronic device while the electronic device is housed and retained within the protective enclosure 1102.

The above figures may depict exemplary configurations for an apparatus of the disclosure, which is done to aid in understanding the features and functionality that can be included in the enclosures described herein. The apparatus is not restricted to the illustrated architectures or configurations, but can be implemented using a variety of alternative architectures and configurations. Additionally, although the apparatus is described above in terms of various exemplary embodiments and implementations, it should be understood that the various features and functionality described in one or more of the individual embodiments with which they are described, but instead can be applied, alone or in some combination, to one or more of the other embodiments of the disclosure, whether or not such embodiments are described and whether or not such features are presented as being a part of a described embodiment. Thus the breadth and scope of the present disclosure, especially in any following claims, should not be limited by any of the above-described exemplary embodiments.

Terms and phrases used in this document, and variations thereof, unless otherwise expressly stated, should be construed as open ended as opposed to limiting. As examples of the foregoing: the term "including" should be read to mean "including, without limitation" or the like; the term "example" is used to provide exemplary instances of the item in discussion, not an exhaustive or limiting list thereof;

and adjectives such as "conventional", traditional", "standard", "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Furthermore, although item, elements or components of the disclosure may be described or claimed in the singular, the plural is contemplated to be within the scope thereof unless limitation to the singular is explicitly stated. The presence of broadening words and phrases such as "one or more", "at least", "but not limited to" or other like phrases in some instances shall not be read to mean that the narrower case is intended or required in instances where such broadening phrases may be absent. Additionally, where a range is set forth, the upper and lower limitations of the range are inclusive of all of the intermediary units therein.

The foregoing disclosure has been presented for purposes of illustration and description. Other modifications and variations may be possible in view of the above teachings. The embodiments described in the foregoing disclosure were chosen to explain the principles of the invention and its practical application to enable others skilled in the art to best utilize the invention. It is intended that the claims be construed to include other alternative embodiments of the invention except as limited by the prior art.

What is claimed is:

1. A protective enclosure for use with an electronic device having a touch screen, the protective enclosure comprising:
    a bottom shell including a back portion and a plurality of walls attached to the back portion at a perimeter of the back portion to form a cavity for receiving and removably retaining the electronic device when the electronic device is installed in the protective enclosure, the bottom shell further including an aperture bounded by the plurality of walls, the aperture configured to provide direct touch access to the touch screen of the installed electronic device, the bottom shell having an inner surface and an outer surface;
    a first cushioning layer overmolded onto at least the inner surface of the back portion of the bottom shell, the first cushioning layer configured to contact and cushion at least a back surface of the installed electronic device when the electronic device is received within the cavity; and
    a second cushioning layer that is separate from the first cushioning layer, the second cushioning layer including a perimeter cushioning member overmolded onto at least a portion of the plurality of walls of the bottom shell, the second cushioning layer configured to contact and cushion one or more sides of the installed electronic device when the electronic device is received within the cavity.

2. The protective enclosure of claim 1 wherein the bottom shell is formed from a material that is more rigid than a material from which the first cushioning layer is formed and is more rigid than a material from which the second cushioning layer is formed.

3. The protective enclosure of claim 1 wherein at least one of the plurality of walls of the bottom shell includes one or more cutouts.

4. The protective enclosure of claim 3 wherein a portion of the second cushioning layer extends through at least one of the one or more cutouts of the walls of the bottom shell.

5. The protective enclosure of claim 4 wherein the portion of the second cushioning layer that extends through the cutout includes a button pad for actuating a control button of the installed electronic device through the portion of the second cushioning layer and without directly contacting the installed electronic device.

6. The protective enclosure of claim 1 further comprising an opening extending through the second cushioning layer and through one of the plurality of walls of the bottom shell to provide access to a side of the installed electronic device from the outside surface of the bottom shell.

7. The protective enclosure of claim 6 wherein a second opening extends through the second cushioning layer and another one of the plurality of walls of the bottom shell to provide access to another side of the installed electronic device from the outside surface of the bottom shell.

8. The protective enclosure of claim 1 further comprising an opening extending through the first cushioning layer and the back of the bottom shell to provide optical access to a camera feature on a back surface of the installed electronic device.

9. The protective enclosure of claim 1 wherein the first cushioning layer includes a plurality of ribs configured to contact a back surface of the installed electronic device to form a plurality of cavities between the first cushioning layer and the back surface of the installed electronic device.

10. The protective enclosure of claim 1 wherein the second cushioning layer includes an elevated protective rim that extends beyond the front surface of the installed electronic device.

11. The protective enclosure of claim 10 wherein the elevated protective rim removably retains the installed electronic device in the protective enclosure.

12. A protective enclosure for use with an electronic device having an interactive touch screen, the protective enclosure comprising:
    an outer shell having a back portion and a plurality of walls attached to the back portion at a perimeter of the back portion to form a cavity for receiving and removably retaining the electronic device when the electronic device is installed in the protective enclosure, the outer shell having an inner surface and an outer surface;
    a first cushion member affixed to the outer shell at least at the inner surface of the of back portion of the outer shell, the first cushion member configured to contact and cushion at least a back surface of the installed electronic device when the electronic device is received within the cavity; and
    a second cushion member affixed to at least a portion of the plurality of walls of the outer shell, the second cushion member configured to contact and cushion one or more sides of the installed electronic device when the electronic device is received within the cavity, wherein the second cushion member is not directly attached to the first cushion member.

13. The protective enclosure of claim 12 wherein at least one of the plurality of walls of the outer shell includes one or more cutouts.

14. The protective enclosure of claim 13 wherein a portion of the second cushion member extends through at least one of the one or more cutouts of the outer shell and includes a button pad for actuating a control button on a side of the installed electronic device through the portion of the second cushion member and without directly contacting the installed electronic device.

15. The protective enclosure of claim 12 wherein the outer shell includes a first cutout in a portion of a first of the plurality of walls and a second cutout in a second of the plurality of walls, wherein the first cutout is opposite the second cutout.

16. The protective enclosure of claim 15 wherein the back portion of the outer shell includes a thinned region between the first cutout and the second cutout, the thinned region of the back portion of the outer shell having a thickness that is less than a thickness of a remainder of the back portion of the outer shell.

17. The protective enclosure of claim 12 further comprising an opening extending through the second cushion member and one of the plurality of walls of the outer shell to provide access to a side of the installed electronic device from the outside surface of the outer shell.

18. The protective enclosure of claim 12 further comprising an opening extending through the first cushion member and the back of the outer shell to provide optical access to a camera feature on a back surface of the installed electronic device.

19. The protective enclosure of claim 12 wherein the first cushion member includes a plurality of ribs configured to contact a back surface of the installed electronic device to form a plurality of cavities between the first cushion member and the back surface of the installed electronic device.

20. The protective enclosure of claim 12 wherein the second cushion member includes an elevated protective rim that extends beyond the front surface of the installed electronic device and removably retains the installed electronic device in the protective enclosure.

\* \* \* \* \*